United States Patent
Kim et al.

(10) Patent No.: US 12,348,202 B2
(45) Date of Patent: Jul. 1, 2025

(54) OPERATIONAL AMPLIFIER CIRCUIT AND OPERATIONAL AMPLIFIER COMPENSATION CIRCUIT FOR AMPLIFYING INPUT SIGNAL AT HIGH SLEW RATE

(71) Applicant: SAMSUNG ELECTRONICS CO., LTD., Suwon-si (KR)

(72) Inventors: Jungmoon Kim, Namyangju-si (KR); Taeksu Kwon, Suwon-si (KR); Yunseok Jang, Anyang-si (KR); Keunhwa Park, Seoul (KR)

(73) Assignee: Samsung Electronics Co., Ltd. (KR)

( * ) Notice: Subject to any disclaimer, the term of this patent is extended or adjusted under 35 U.S.C. 154(b) by 653 days.

(21) Appl. No.: 17/691,428

(22) Filed: Mar. 10, 2022

(65) Prior Publication Data
US 2022/0368297 A1   Nov. 17, 2022

(30) Foreign Application Priority Data

May 14, 2021 (KR) .................. 10-2021-0062745
Jul. 20, 2021 (KR) .................. 10-2021-0095157

(51) Int. Cl.
*H03F 3/45* (2006.01)
*H03F 3/30* (2006.01)
*G09G 3/20* (2006.01)

(52) U.S. Cl.
CPC .......... *H03F 3/45179* (2013.01); *G09G 3/20* (2013.01); *G09G 2310/0291* (2013.01)

(58) Field of Classification Search
CPC ............. H03F 3/45179; H03F 3/45219; H03F 2203/45248; H03F 1/301; G09G 3/20; G09G 2310/0291; G09G 2300/0408; G09G 2310/027; G09G 2320/0252
USPC .................................... 330/252–261
See application file for complete search history.

(56) References Cited

U.S. PATENT DOCUMENTS

| 5,283,478 | A | 2/1994 | Maloberti et al. |
| 7,554,403 | B1 | 6/2009 | Sakurai |
| 7,978,010 | B2 | 6/2011 | Lee |
| 9,543,912 | B2 * | 1/2017 | Lee ............... H03F 3/301 |
| 10,014,851 | B2 | 7/2018 | Chauhan et al. |
| 2006/0091961 | A1 | 5/2006 | Briskin et al. |

FOREIGN PATENT DOCUMENTS

| KR | 1020190087414 | 7/2019 |
| KR | 102074230 | 2/2020 |

* cited by examiner

*Primary Examiner* — Hieu P Nguyen
(74) *Attorney, Agent, or Firm* — Fish & Richardson P.C.

(57) ABSTRACT

An operational amplifier compensation circuit includes; a first transistor activated/deactivated in response to a signal level difference between an input signal applied to an operational amplifier and an output signal provided by the operational amplifier, a first signal amplifying circuit including a second transistor and a first load, wherein the first signal amplifying circuit is configured to generate a first gate voltage amplified in response to the voltage level difference between the input signal and the output signal in relation to an internal resistance of the second transistor and a resistance of the first load when the first transistor is activated, and a third transistor configured to generate a first compensation current in response to the amplified first gate voltage and provide the first compensation current to the operational amplifier.

18 Claims, 17 Drawing Sheets

OPERATIONAL AMPLIFIER CIRCUIT AND OPERATIONAL AMPLIFIER COMPENSATION CIRCUIT FOR AMPLIFYING INPUT SIGNAL AT HIGH SLEW RATE

CROSS-REFERENCE TO RELATED APPLICATIONS

This application claims priority under 35 U.S.C. § 119 to Korean Patent Application No. 10-2021-0062745 filed on May 14, 2021, and Korean Patent Application No. 10-2021-0095157 filed on Jul. 20, 2021, the collective subject matter of which is hereby incorporated by reference in its entirety.

BACKGROUND

The inventive concept relates generally to operational amplifier circuits and operational amplifier compensation circuits. More particularly, the inventive concept relate to operational amplifier circuits providing high slew rates, as well as operational amplifier compensation circuits associated with same.

Display devices are widely used in smartphones, notebook computers, and monitors and often include a display panel configured to display an image. Here, the display panel includes a vast plurality of pixels driven by a data signal generated by a display driver integrated circuit (IC). The nature and quality of the data signal is an important factor in the display of the image by the display panel.

In this regard, the display driver IC should shorten a settling time of a source amplifier so as to drive the pixels at a high slew rate. Here, "settling time" may be understood as a time required for an output signal (e.g., a signal corresponding to an input signal) to fall within a defined range associated with a stable state value. A reduced settling time improves resolution, as well as a frame rate, of an image provided by the display panel.

SUMMARY

Embodiments of the inventive concept provide operational amplifier circuits and operational amplifier compensation circuits that efficiently reduce settling time.

According to an aspect of the inventive concept, an operational amplifier compensation circuit may include; a first transistor activated/deactivated in response to a signal level difference between an input signal applied to an operational amplifier and an output signal provided by the operational amplifier, a first signal amplifying circuit including a second transistor and a first load, wherein the first signal amplifying circuit is configured to generate a first gate voltage amplified in response to the voltage level difference between the input signal and the output signal in relation to an internal resistance of the second transistor and a resistance of the first load when the first transistor is activated, and a third transistor configured to generate a first compensation current in response to the amplified first gate voltage and provide the first compensation current to the operational amplifier.

According to another aspect of the inventive concept, an operational amplifier circuit may be used to compensate for a slew rate of an output signal provided by the operational amplifier circuit, wherein operational amplifier circuit may include; an amplifying circuit configured to provide an amplification signal by amplifying a difference between an input signal applied to the operational amplifier circuit and the output signal, an output circuit configured to generate the output signal in response to the amplification signal, and a compensation circuit configured to receive the amplification signal and provide a compensation current generated in response to the amplification signal to the output circuit, wherein the output circuit is further configured to generate the output signal in relation to the compensation current to reduce a signal level shift time.

According to another aspect of the inventive concept, an operational amplifier compensation circuit may include; a first input transistor configured to generate a first current in response to a difference between an input signal applied to an operational amplifier and an output signal provided by operational amplifier, a first current mirror circuit connected to a source/drain of the first input transistor and generating a second current having a same level as a level of the first current, a second current mirror circuit configured to receive the second current and generate a third current, and an additional compensation circuit including a first additional compensation transistor and a first load, wherein the additional compensation circuit is configured to provide the second current mirror circuit with an additional compensation current generated in response to an internal resistance of the first additional compensation transistor and a resistance of the first load when the first input transistor is activated, wherein a compensation current obtained by summating the additional compensation current and the third current is provided to the operational amplifier.

BRIEF DESCRIPTION OF THE DRAWINGS

Embodiments of the inventive concept may be more clearly understood upon consideration of the following detailed description together with the accompanying drawings in which.

DETAILED DESCRIPTION

Throughout the written description and drawings, like reference numbers and labels are used to denote like or similar elements, components and/or features.

Figure 1:
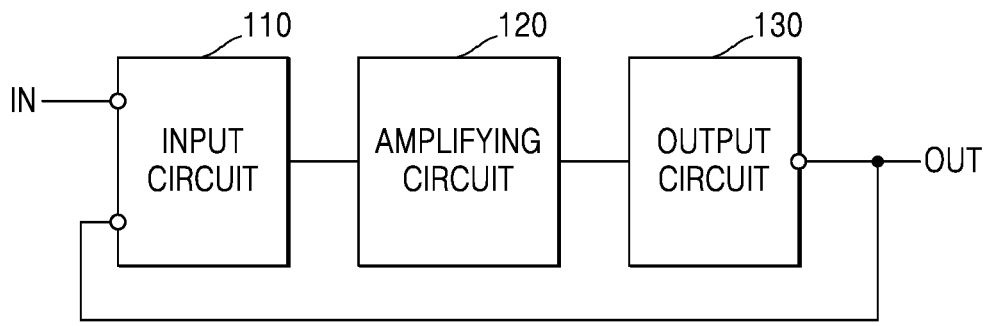
FIG. 1 is a block diagram generally illustrating an operational amplifier.

FIG. 1 is a block diagram illustrating an operational amplifier 10.

Referring to FIG. 1, the operational amplifier 10 may include an input circuit 110, an amplifying circuit 120, and an output circuit 130.

The input circuit 110 may receive as inputs; an input signal IN applied to the operational amplifier 10 and an output signal OUT provided by the operational amplifier 10. The input circuit 110 may output a differential current in response to a voltage difference between the input signal IN and the output signal OUT. For example, the input circuit 110 may receive the input signal IN through a first (or positive +) input terminal may receive the output signal OUT through a second (or negative −) input terminal.

The amplifying circuit 120 may include a plurality of resistors that receive the differential current generated by the input circuit 110 and generate an amplified voltage signal in response to the differential current. For example, the amplifying circuit 120 may include passive and/or active resistors having a high resistance value and may output an amplification signal having a voltage level obtained by multiplying a level of the differential current by a resistance value. In some embodiments, the amplifying circuit 120 may output the amplification signal through a plurality of output terminals, and the output circuit 130 may receive the amplification signal through a plurality of input terminals.

The output circuit 130 may receive the amplification signal and generate the output signal OUT as an amplified response to the input signal IN. For example, the output circuit 130 may include a capacitor that stores electrical charge received as the amplification signal and may generate the output signal OUT in response to (or in proportion to) the electrical charge stored in the capacitor.

However, as the operational amplifier 10 generates the output signal OUT using the combination of the input circuit 110, the amplifying circuit 120, and the output circuit 130, a delay may arise due to the charging/discharging of electrical charge by the capacitor. As a result of this signal processing delay, a compensating "delay time" is required, such that the output signal OUT corresponding to the input signal IN settles within a defined range associated with a stable state value. This delay time may be referred to as a "settling time."

Figure 2:
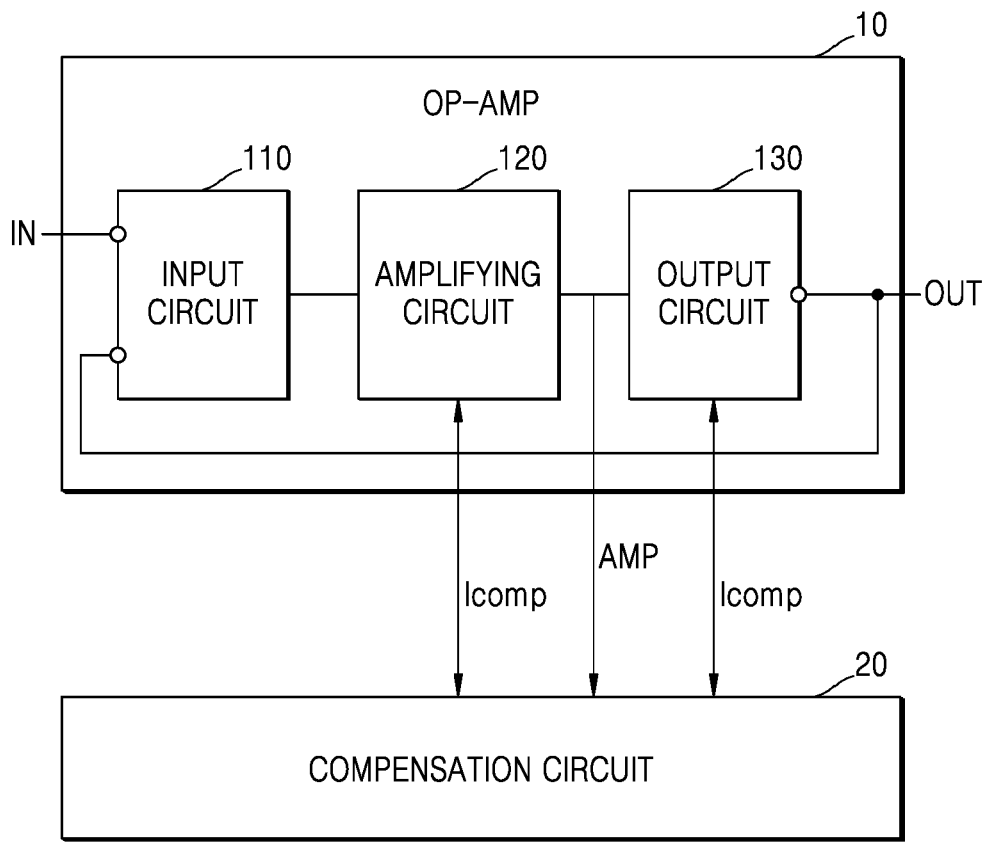
FIG. 2 is a block diagram illustrating a combination of an operational amplifier and an operational amplifier compensation circuit according to embodiments of the inventive concept.

FIG. 2 is a block diagram illustrating the operational amplifier 10 of FIG. 1 together with an operational amplifier compensation circuit 20 according to embodiments of the inventive concept.

Referring to FIG. 2, the operational amplifier compensation circuit 20 may be used in conjunction with the operational amplifier circuit 10 to decrease delay. In this regard, the operational amplifier compensation circuit 20 may provide a compensation current Icomp to at least one of the amplifying circuit 120 and the output circuit 130, thereby decreasing delay associated with operation of the operational amplifier 10. For example, the operational amplifier compensation circuit 20 may provide the compensation current Icomp to a capacitor included in one of the amplifying circuit 120 and the output circuit 130, in order to adjust (e.g., increase) a charge rate and/or a discharge rate of the capacitor.

In various embodiments, the operational amplifier compensation circuit 20 may receive the input signal IN applied to the operational amplifier 10 and an output signal OUT provided by the operational amplifier 10 in order to generate the compensation current Icomp in response to a signal level difference between the input signal IN and the output signal OUT. Accordingly, a level of the compensation current Icomp may be proportional to a voltage level obtained by multiplying a drain current level (e.g., a level generated in response to the signal level difference between the input signal IN and the output signal OUT) by a resistance value of an element included in the operational amplifier compensation circuit 20. That is, the operational amplifier compensation circuit 20 may provide the operational amplifier 10 with the compensation current Icomp having a level that is amplified in response to a drain current. Hereinafter, an amplified level of the compensation current Icomp in response to the drain current may be referred to as a "gain level."

In some embodiments, the operational amplifier compensation circuit 20 may further receive an amplification signal AMP—different from the input signal IN and the output signal OUT—the operational amplifier 10, and may adjust a gain level corresponding to the drain current in response to the amplification signal AMP. In some embodiments, the operational amplifier compensation circuit 20 may further include a source degeneration transistor having an activation level that is determined in response to a level of the amplification signal AMP, such that when the source degeneration transistor is activated, the gain level may be reduced and a stable compensation current Icomp and output signal OUT may be generated.

Figure 3:
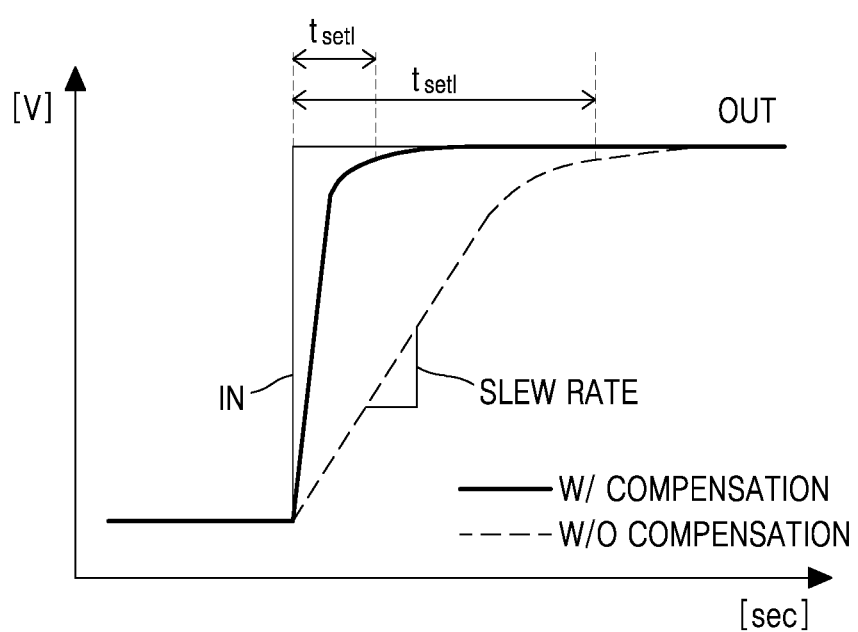
FIG. 3 is a graph comparing output signal slew rates for a comparative example and an embodiment of the inventive concept.

FIG. 3 is a graph comparing output signal OUT slew rates between a comparative example and an embodiment of the inventive concept.

That is, referring to FIG. 3, performance of the operational amplifier 10, standing alone, verses performance of the operational amplifier 10 together with the operational amplifier compensation circuit 20 are compared-particularly as relates to slew rate. Namely, the slew rate of the output signal OUT is much higher when the operational amplifier compensation circuit 20 is used in combination with the operational amplifier 10. And given this higher slew rate, the settle time required for the output signal OUT to reach range associated with a stable state value may be reduced. That is, operational amplifier circuits including the operational amplifier compensation circuit 20 according to embodiments of the inventive concept may exhibit a reduced settling time $t_{set1}$.

This is a material outcome because when display apparatuses are driven at high speed, comparative operational amplifier circuits may provide insufficient margin of the settling time $t_{set1}$, thereby generating the output signal OUT with a less accurately defined voltage level. In this regard, the margin of the settling time $t_{set1}$ may denote a time other than (or in addition to) the settling time $t_{set1}$ during a period in which the display apparatus is driven at high speed. For example, in one comparative example assuming that a display apparatus is driven at 144 Hz or higher, the margin of the settling time $t_{set1}$ may be insufficient, and display luminance may decrease by a voltage difference which does not reach a stable state value. This may be regarded as a latent defect factor.

In contrast, operational amplifier circuits according to embodiments of the inventive concept generate a compensation current using the operational amplifier compensation circuit 20 that ensures the margin of the settling time $t_{set1}$. Accordingly, a display apparatus incorporating an operational amplifier circuit according to embodiments of the inventive concept may operate at high speed, yet stably output an image having a desired luminance.

Figure 4:
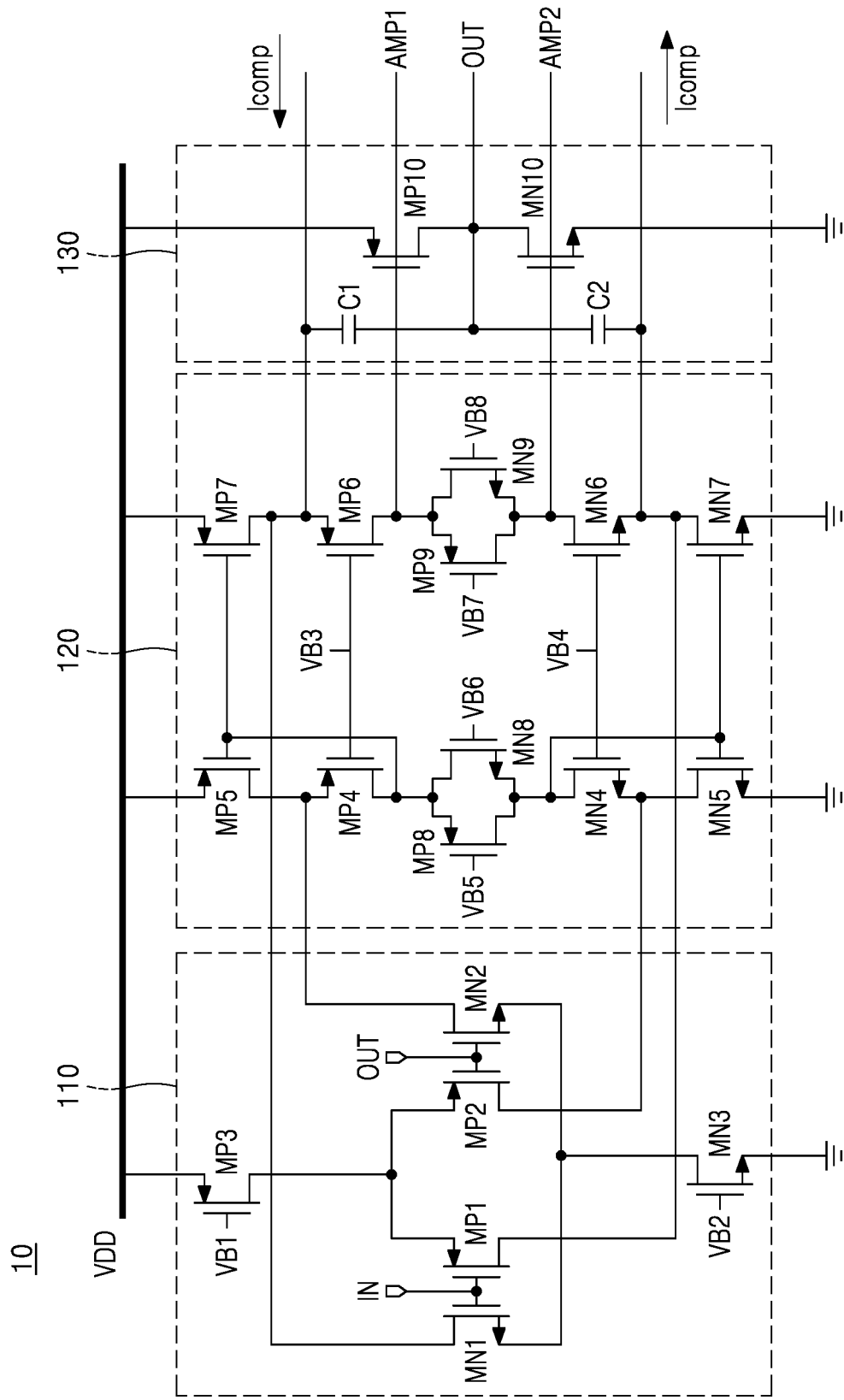
FIG. 4 is a circuit diagram illustrating an operational amplifier 10 according to embodiments of the inventive concept.

FIG. 4 is a circuit diagram further illustrating in one example the operational amplifier 10 of FIG. 1.

Referring to FIGS. 1 and 4, the operational amplifier 10 includes the input circuit 110, the amplifying circuit 120, and the output circuit 130. Each of the input circuit 110, the amplifying circuit 120, and the output circuit 130 may include transistor, wherein for each transistor, a gate terminal (or gate), a source terminal (or source), and/or a drain terminal (or drain) may be organically connected to different transistor(s) and may output an output signal OUT and at least one amplification signal (e.g., first and second amplification signals AMP1 and AMP2). Hereafter, one of a source or a drain of a transistor will be denoted by the term "source/drain."

In some embodiments, the input circuit 110 may include a folded-cascode operational transconductance amplifier (OTA). The folded-cascode OTA may be used to convert a voltage difference into a current, and then variously communicate the current. For example, the input circuit 110 may include P-type Metal Oxide Semiconductor (MOS) (PMOS) transistors MP1, MP2 and MP3, include N-type MOS (NMOS) transistors MN1, MN2 and MN3, receive the input signal IN, and provide the output signal OUT as a differential current.

That is, the input circuit 110 may include a first differential input circuit including the transistor MP1 and the transistor MP2, and a second differential input circuit including the transistor MN1 and the transistor MN2. The transistor MP3 and the transistor MN3 may supply a bias current to the first differential input circuit and the second differential input circuit.

The transistor MP3 may apply a constant bias current to the first differential input circuit in response to a first bias voltage VB1, and the transistor MN3 may apply a constant bias current to the second differential input circuit in response to a second bias voltage VB2.

Each of the first differential input circuit and the second differential input circuit may separate a bias current in response to a differential input signal and may output a separated current as a differential current to the amplifying circuit 120. That is, the input circuit 110 may convert a voltage difference between the input signal IN and the output signal OUT into a current and may output the current to the amplifying circuit 120.

The amplifying circuit 120 may include a current mirror circuit including PMOS transistors MP4, MP5, MP6, MP7, MP8 and MP9, and NMOS transistors MN4, MN5, MN6, MN7, MN8 and MN9. The amplification circuit 120 may amplify the differential current input from the input circuit 110. The NMOS transistors MN4, MN5, MN6 and MN7 of the amplifying circuit 120 may be connected to the first differential input circuit, and the PMOS transistors MP4, MP5, MP6, and MP7 may be connected to the second differential input circuit.

The transistor MP4 and the transistor MP5 may be serially connected between a source voltage VDD and each of the transistor MP8 and the transistor MN8, and the transistor MP6 and the transistor MP7 may be serially connected between the source voltage VDD and each of the transistor MP9 and the transistor MN9. The transistor MN4 and the transistor MN5 may be serially connected between ground, and each of the transistor MP8 and the transistor MN8, and the transistor MN6 and the transistor MN7 may be serially connected between ground and each of the transistor MP9 and the transistor MN9. A third bias voltage VB3 may be applied to the gates of the transistors MP4 and MP6, and a fourth bias voltage VB4 may be applied to the gates of the transistors MN4 and MN6.

The PMOS transistor MP8 and the NMOS transistor MN8 may be connected in parallel and may respectively receive a fifth bias voltage VB5 and a sixth bias voltage VB6 to generate a constant static bias current. The PMOS transistor MP9 and the NMOS transistor MN9 may be connected in parallel and may respectively receive a seventh bias voltage VB7 and an eighth bias voltage VB8 to generate a constant static bias current.

The output circuit 130 may include first and second capacitors C1 and C2, a PMOS transistor MP10, and an NMOS transistor MN10. The output circuit 130 may receive amplified voltages from the transistor MP9 and the transistor MN9 to generate the amplification signals AMP1 and AMP2. The first and second capacitors C1 and C2 may be used to stabilize frequency characteristic(s) of the output signal OUT. Thus, under certain conditions, the first and second capacitors C1 and C2 may prevent the output signal OUT from being generated.

A source of the transistor MP10 of the output circuit 130 may be connected to the source voltage VDD, a gate thereof may be connected to a drain of the transistor MP6, and a drain thereof may be connected to a drain of the transistor MN10 and an output terminal at which the output signal OUT is apparent. A source of the transistor MN10 may be connected to ground, a gate thereof may be connected to a drain of the transistor MN6, and a drain thereof may be connected to a drain of the transistor MP10 and an output terminal at which the output signal OUT is apparent.

The input circuit 110 described above may be biased by direct current (DC) bias voltages VB1 and VB2, and thus, a slew rate based thereon may be expressed by Equation 1 below.

$$\text{Slew Rate} = (I_{TAIL})/C_c, \quad \quad \text{Equation 1}$$

wherein, $I_{TAIL}$ denotes a DC bias current value generated from the DC bias voltage VB1 or VB2, and $C_c$ denotes a capacitance value associated with at least one of the first and second capacitors C1 and C2 of the output circuit 130.

In this case, in some embodiments, a slew rate of the operational amplifier 10 receiving the compensation current Icomp may be expressed by Equation 2 below.

$$\text{Slew Rate} = (I_{TAIL} + I\text{comp}/2)/C_c, \quad \text{Equation 2}$$

wherein Icomp denotes the compensation current Icomp generated by the operational amplifier compensation circuit 20.

That is, a slew rate of the output signal OUT generated by receiving the compensation current Icomp may have a value which is greater than a slew rate of the output signal OUT generated in the absence of the compensation current Icomp.

Figure 5:
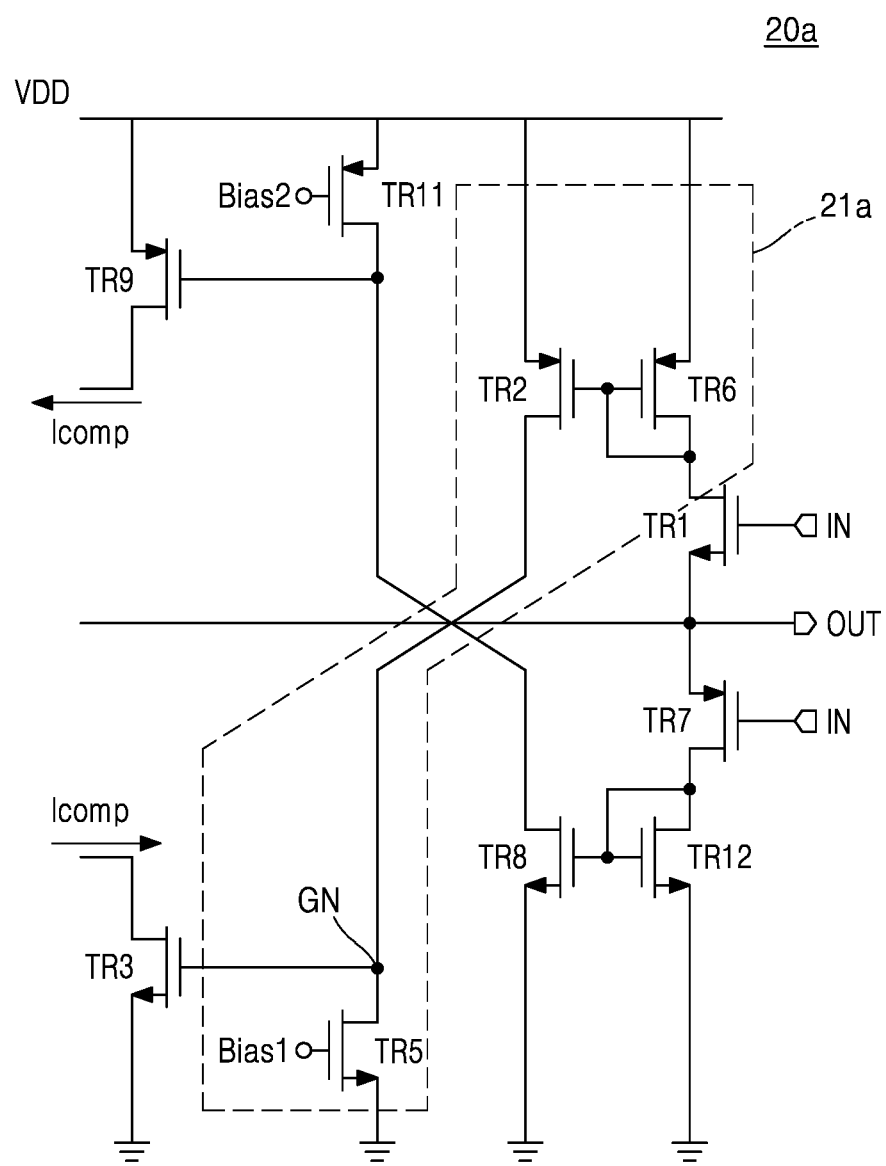
FIG. 5 is a circuit diagram illustrating an operational amplifier compensation circuit according to embodiments of the inventive concept.

FIG. 5 is a circuit diagram illustrating a variation (20a) of the operational amplifier compensation circuit 20 of FIG. 2 according to embodiments of the inventive concept.

Referring to FIG. 5, the operational amplifier compensation circuit 20a may include a first partial compensation circuit including first, second, third, fifth and sixth transistors TR1, TR2, TR3, TR5 and TR6 and a second partial compensation circuit including seventh, eighth, ninth, eleventh and twelfth transistors TR7, TR8, TR9, TR11 and TR12. When a voltage level difference between an output signal OUT and an input signal IN is greater than a threshold voltage of the first transistor TR1, the first partial compensation circuit may be controlled so that an operational amplifier 10 provides a compensation current Icomp to an operational amplifier compensation circuit, and when the voltage level difference between the input signal IN and the output signal OUT is greater than a threshold voltage of the seventh transistor TR7, the second partial compensation circuit may be controlled to provide the compensation current Icomp to the operational amplifier 10. That is, the first partial compensation circuit may operate when the input signal IN shifts from low to high, and the second partial compensation circuit may operate when the input signal IN shifts from high to low.

The first partial compensation circuit may include the first transistor TR1, a first signal amplifying circuit 21a, and the third transistor TR3. The first transistor TR1 may be activated when the voltage level difference between the input signal IN and the output signal OUT is greater than a threshold voltage thereof. When the first transistor TR1 is activated, the first transistor TR1 may generate a drain current proportional to the voltage level difference between the input signal IN and the output signal OUT.

The first signal amplifying circuit 21a may include the second transistor TR2, the fifth transistor TR5, and the sixth transistor TR6. A gate and a drain of the sixth transistor TR6 may be connected to a drain of the first transistor TR1. Thus, the sixth transistor TR6 may be self-biased. A gate of the second transistor TR2 may be connected to the gate of the sixth transistor TR6, and the second transistor TR2 and the sixth transistor TR6 may configure a current mirror. Therefore, a drain current of the first transistor TR1 may be copied to a drain current of the second transistor TR2.

The fifth transistor TR5 included in the first signal amplifying circuit 21a may be connected to a drain of the second transistor TR2 and may receive a first bias signal Bias1 through a gate thereof, and thus, may operate as a load having a variable resistance value in response to a voltage level of the first bias signal Bias1. In relation to the operational amplifier compensation circuit 20a of FIG. 5, a load disposed between ground and a drain of the second transistor TR2 may be an active load configured with a transistor as illustrated in FIG. 5, however the scope of the inventive concept is not limited thereto, and other embodiments may be configured with a passive load.

In some embodiments, the second transistor TR2 of the first signal amplifying circuit 21a may operate as a common source amplifier, where the fifth transistor TR5 is a load. A voltage gain of the common source amplifier may be expressed by Equation 3 below.

$$Av = -gm(Rd//ro), \quad \text{Equation 3}$$

wherein 'Rd' denotes a resistance value of a load connected to an output terminal of the common source amplifier, and 'ro' denotes an internal resistance of a transistor.

Referring still to FIG. 5, the load connected to the output terminal of the common source amplifier may be the fifth transistor TR5, and thus, Rd may denote a resistance value of the fifth transistor TR5 and ro may denote an internal resistance (e.g., a second internal resistance) of the second transistor TR2. That is, an output voltage value of the first signal amplifying circuit 21a may have a voltage value amplified in response to the internal resistance of the second transistor TR2 and an internal resistance (e.g., a fifth internal resistance) of the fifth transistor TR5 with respect to a difference between the input signal IN and the output signal OUT.

An output voltage of the second transistor TR2 may be input to a gate of the third transistor TR3, and thus, may control the third transistor TR3. The compensation current Icom generated at a drain of the third transistor TR3 may have a level which is determined in response to a gate voltage input to a gate of the third transistor TR3. That is, a voltage value may be amplified in response to the internal resistance of the second transistor TR2 and the internal resistance of the fifth transistor TR5, and thus, a current value of the compensation current Icom may also have a value which is amplified from a drain current of the first transistor TR1.

In some embodiments, the third transistor TR3 may generate a pull compensation current Icomp for sinking a current of the operational amplifier 10. Referring to FIG. 4, in response to a low first amplification signal AMP1, the transistor MP10 may be activated, and thus, a voltage level of the output signal OUT may increase. Here, a speed at which a second capacitor is charged from the source voltage VDD by the pull compensation current Icomp may increase, and thus, a slew rate when the output signal OUT increases may increase.

The second partial compensation circuit may include the seventh transistor TR7, a second signal amplifying circuit, and the ninth transistor TR9. The seventh transistor TR7 may be activated when a voltage level difference between the input signal IN and the output signal OUT is greater than a threshold voltage thereof. When the seventh transistor TR7 is activated, the seventh transistor TR7 may generate a drain current proportional to the voltage level difference between the input signal IN and the output signal OUT.

The second signal amplifying circuit may include the eighth transistor TR8, the eleventh transistor TR11, and the twelfth transistor TR12. A gate and a drain of the twelfth transistor TR12 may be connected to a drain of the seventh transistor TR7, and thus, the twelfth transistor TR12 may be self-biased. A gate of the eighth transistor TR8 may be connected to a gate of the twelfth transistor TR12, and the eighth transistor TR8 and the twelfth transistor TR12 may configure a current mirror. Therefore, a drain current of the seventh transistor TR7 may be generated as a drain current of the eighth transistor TR8.

The eleventh transistor TR11 included in the second signal amplifying circuit may be connected to a drain of the eighth transistor TR8 and may receive a second bias signal Bias2 through a gate thereof, and thus, may operate as a load having a variable resistance value in response to a voltage level of the second bias signal Bias2. In the operational amplifier compensation circuit 20a in some embodiments, a load disposed between ground and a drain of the eleventh transistor TR11 may be an active load configured with a transistor as in FIG. 5, but the inventive concept is not limited thereto, and other embodiments may be configured as a passive load.

The second signal amplifying circuit in some embodiments, like the first signal amplifying circuit 21a, may operate as a common source amplifier. Referring to FIG. 5, the load connected to the output terminal of the common source amplifier may be the eleventh transistor TR11, and thus, a voltage gain of the common source amplifier may be proportional to a parallel resistance value of an internal resistance (e.g., an eleventh internal resistance) of the eleventh transistor TR11 and an internal resistance (e.g., an eighth internal resistance) of the eighth transistor TR8. That is, an output voltage value of the second signal amplifying circuit may have a voltage value amplified in response to an internal resistance (e.g., a eighth internal resistance) of the eighth transistor TR8 and the internal resistance of the eleventh transistor TR11 with respect to the difference between the input signal IN and the output signal OUT.

An output voltage of the eighth transistor TR8 may be input to a gate of the ninth transistor TR9, and thus, may control the ninth transistor TR9. The compensation current Icom generated at a drain of the ninth transistor TR9 may have a level which is determined in response to a gate voltage input to the gate thereof. That is, a voltage value may be amplified in response to an internal resistance of the eighth transistor TR8 and the internal resistance of the eleventh transistor TR11, and thus, a current value of the compensation current Icom may also have a value which is amplified from a drain current of the seventh transistor TR7.

In some embodiments, the ninth transistor TR9 may generate a push compensation current Icomp for supplying a current to the operational amplifier 10. Referring to FIG. 4, in response to a high second amplification signal AMP2, the transistor MN10 may be activated, and thus, a voltage level of the output signal OUT may decrease. Here, a speed at which a voltage of a first capacitor is discharged to ground by the push compensation current Icomp may increase, and thus, a slew rate when the output signal OUT decreases may increase.

Figure 6A:
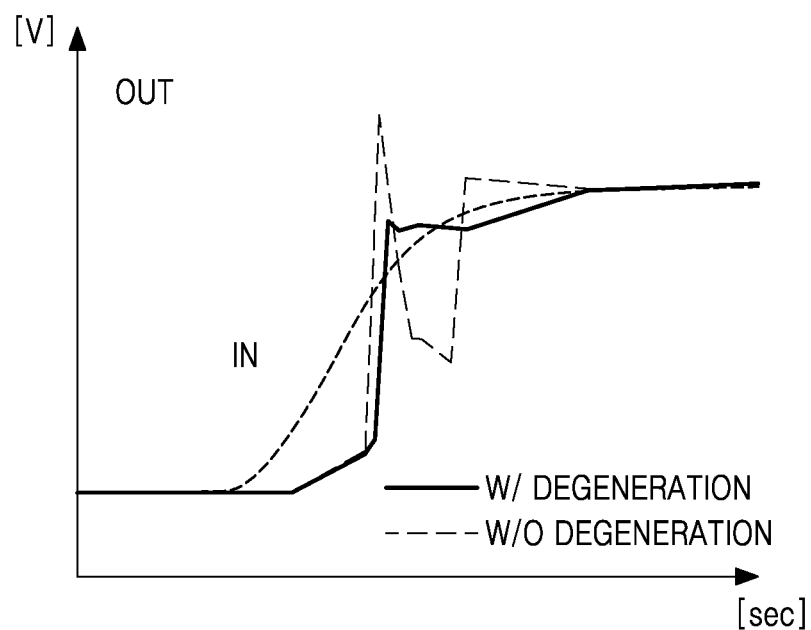
FIGS. 6A and 6B are respective graphs illustrating a gate voltage and an output signal of an operational amplifier circuit in response to the presence of a source degeneration transistor.
Figure 6B:
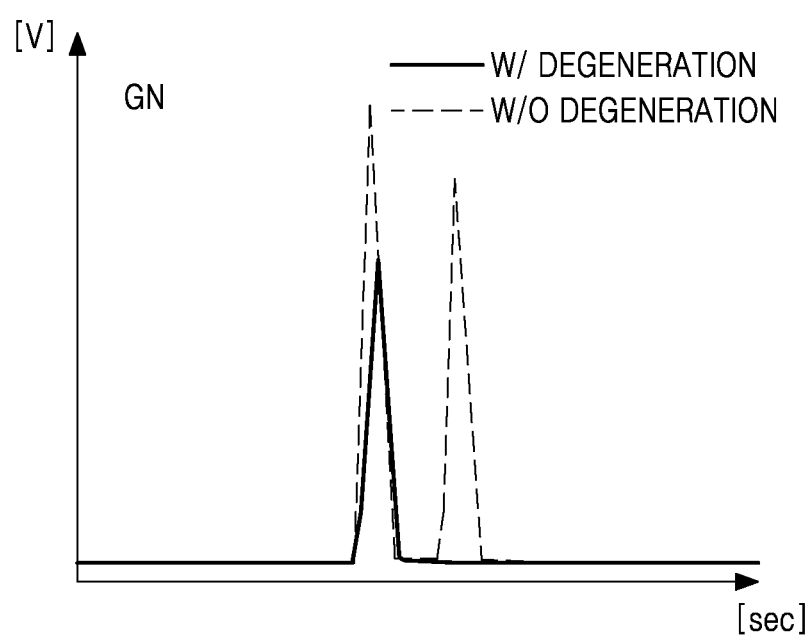

FIGS. 6A and 6B are respective graphs illustrating a gate voltage and an output signal of an operational amplifier circuit in relation to the presence of a source degeneration transistor.

Assuming the embodiment of FIG. 5, the operational amplifier compensation circuit 20a may shift a voltage level of the output signal OUT at a high slew rate using the common source amplifier having a high voltage gain. In this case, and referring to FIG. 6A, an output signal OUT generated in response to a high voltage gain may be a signal overshot in response to a target level and may be generated when a voltage level difference between the output signal OUT and an input signal IN after a level shifts is higher than a threshold voltage.

For example, in FIG. 6A, when a voltage level of the input signal IN is higher than a voltage level of the output signal OUT by a threshold voltage value or more, the first partial compensation circuit may be activated, and the input signal IN may shift from low to high. In this case, when the operational amplifier compensation circuit 20a amplifies a compensation current Icomp in response to a high voltage gain, the output signal OUT excessively amplified compared to the voltage level of the input signal IN may be generated, and when the voltage level of the output signal OUT is higher than the voltage level of the input signal IN by the threshold voltage value or more, the second partial compensation circuit may be activated. Therefore, the operational amplifier circuit may again decrease in voltage, and thus, an unstable output signal OUT may be generated.

Referring to FIG. 6B, in a gate voltage generated and amplified in a gate node GN of the third transistor TR3 of the first partial compensation circuit of FIG. 5, a plurality of peak voltages may be generated in a process of shifting a logic level. For example, when the output signal OUT is reduced as the second partial compensation circuit is activated, the voltage level of the input signal IN may be higher than the voltage level of the output signal OUT again, and at this time, a peak voltage may be generated in the gate node GN of the third transistor TR3 again.

In contrast, when a source degeneration transistor is included in the operational amplifier compensation circuit 20a, a voltage gain may be controlled, and thus, the operational amplifier circuit may generate a stable output signal OUT. Hereinafter, an embodiment where an operational amplifier circuit may generate a stable output signal OUT using a source degeneration transistor will be described.

Figure 7:
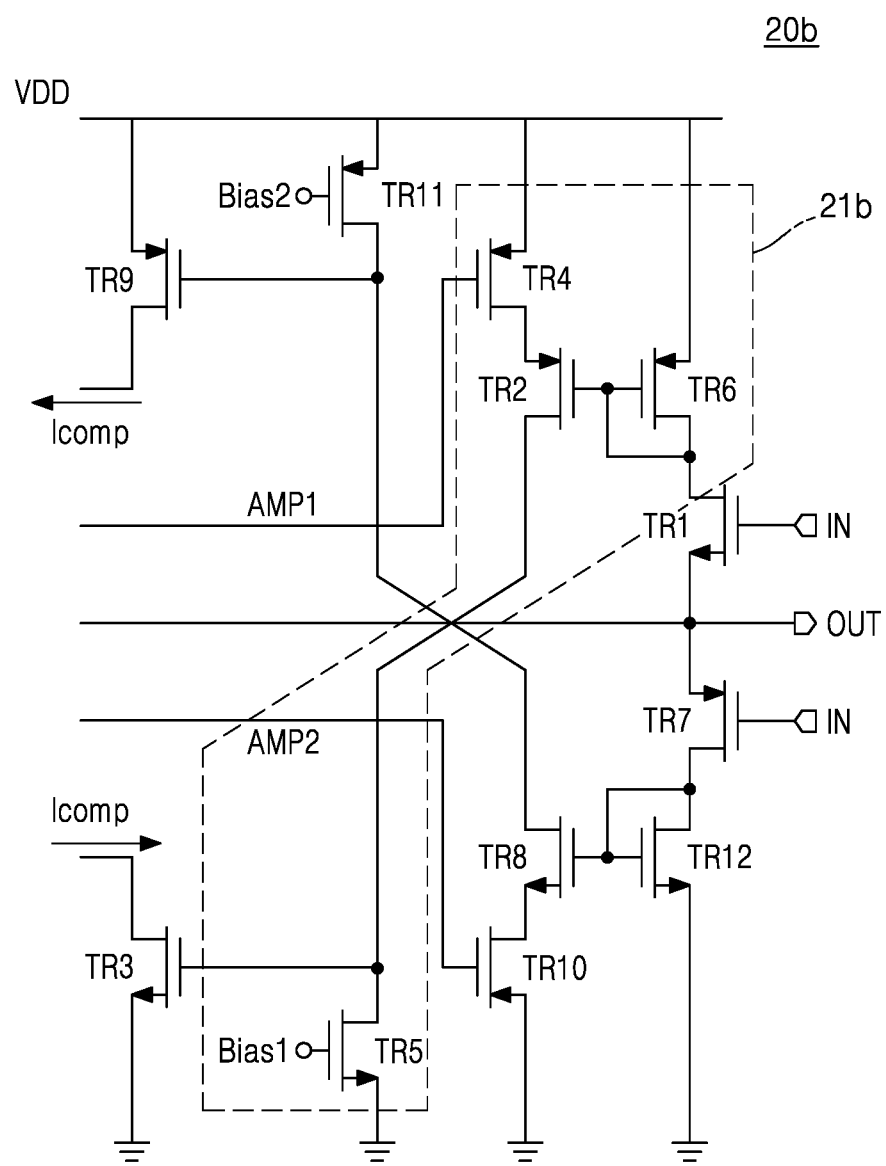
FIG. 7 is a circuit diagram illustrating an operational amplifier compensation circuit further including a source degeneration transistor according to embodiments of the inventive concept.

FIG. 7 is a circuit diagram illustrating another variation (20b) of the operational amplifier compensation circuit 20 of FIG. 2 further including a source degeneration transistor according to embodiments of the inventive concept.

Referring to FIG. 7, a first partial compensation circuit 21b of the operational amplifier compensation circuit 20b may further include a fourth transistor TR4 in the first partial compensation circuit 21a according to the embodiment of FIG. 5. The fourth transistor TR4 may be disposed between a source of a second transistor TR2 and a source voltage VDD, and a gate of the fourth transistor TR4 may receive a first amplification signal AMP1 from an amplifying circuit 120. When the fourth transistor TR4 is activated, the fourth transistor TR4 may perform a function of a load which is coupled to the source of the second transistor TR2 to reduce a voltage gain of a common source amplifier and to generate a stable output voltage. Hereinafter, the fourth transistor TR4 may be referred to as a source degeneration transistor.

In a case where the fourth transistor TR4 is a load and performs a source degeneration operation, the voltage gain of the common source amplifier may be expressed by Equation 4 below.

$$Av = -\frac{(Rd//ro)}{\frac{1}{g_m} + R_s}, \qquad \text{[Equation 4]}$$

wherein 'Rs' denotes an internal resistance of a source degeneration transistor.

That is, an output voltage value of the first signal amplifying circuit 21b of FIG. 7 may have a voltage value amplified in response to an internal resistance of the second transistor TR2, an internal resistance of the fourth transistor TR4, and an internal resistance of the fifth transistor TR5 with respect to a difference between an input signal IN and an output signal OUT. The output voltage value of the first signal amplifying circuit 21b may be a voltage value which is less amplified than the embodiment of FIG. 5, but slewing of the operational amplifier 10 may be stably performed and excessive non-linearity may be reduced.

Of note, the source degeneration transistor in some embodiments of the inventive concept may receive an amplification signal AMP—different from the input signal IN and the output signal OUT of the operational amplifier 10—through a gate, such that activation or deactivation (hereafter, "activation/deactivation", and similarly "activate/deactivate", or "activated/deactivated") of the source degeneration transistor may be determined in response to a voltage level of the amplification signal AMP.

Referring to FIG. 4, when a voltage level difference between the input signal IN and the output signal OUT is relatively large, the operational amplifier 10 may shift a voltage level of the amplification signal AMP to drive the output circuit 130. As the voltage level of the amplification signal AMP shifts, timing at which the output circuit 130 is driven may be similar to timing at which the operational amplifier compensation circuit 20b in some embodiments is driven. Thus, the operational amplifier compensation circuit 20b may receive the amplification signal AMP from the operational amplifier 10 to determine whether to drive the first partial compensation circuit 21b and the second partial compensation circuit. Hereinafter, a transistor, which is activated when the first partial compensation circuit 21b and the second partial compensation circuit are driven, and the resulting current flow in response thereto will be described in some additional detail hereafter.

Figure 8A:
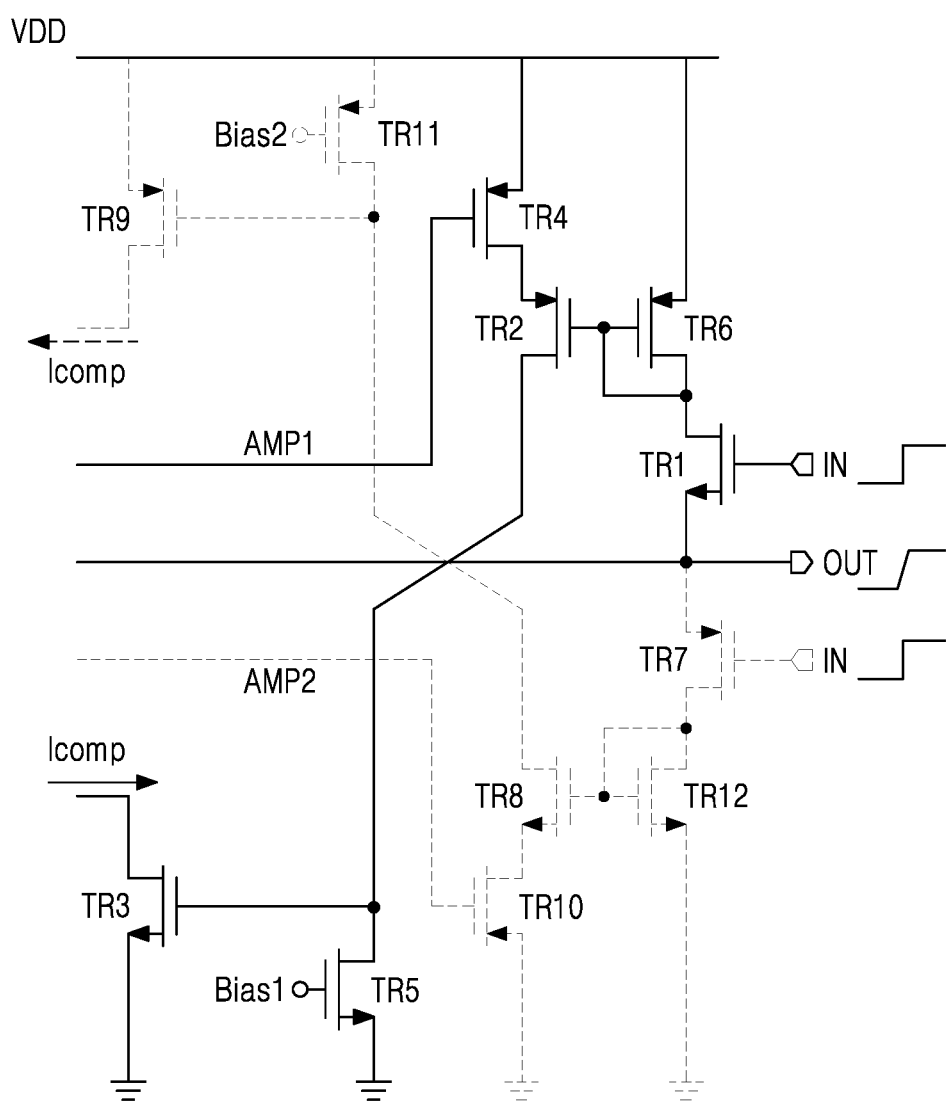
FIGS. 8A and 8B are respective circuit diagrams illustrating a transistor activated in response to an input signal shift and resulting current flow in relation to the embodiment of FIG. 7.
Figure 8B:
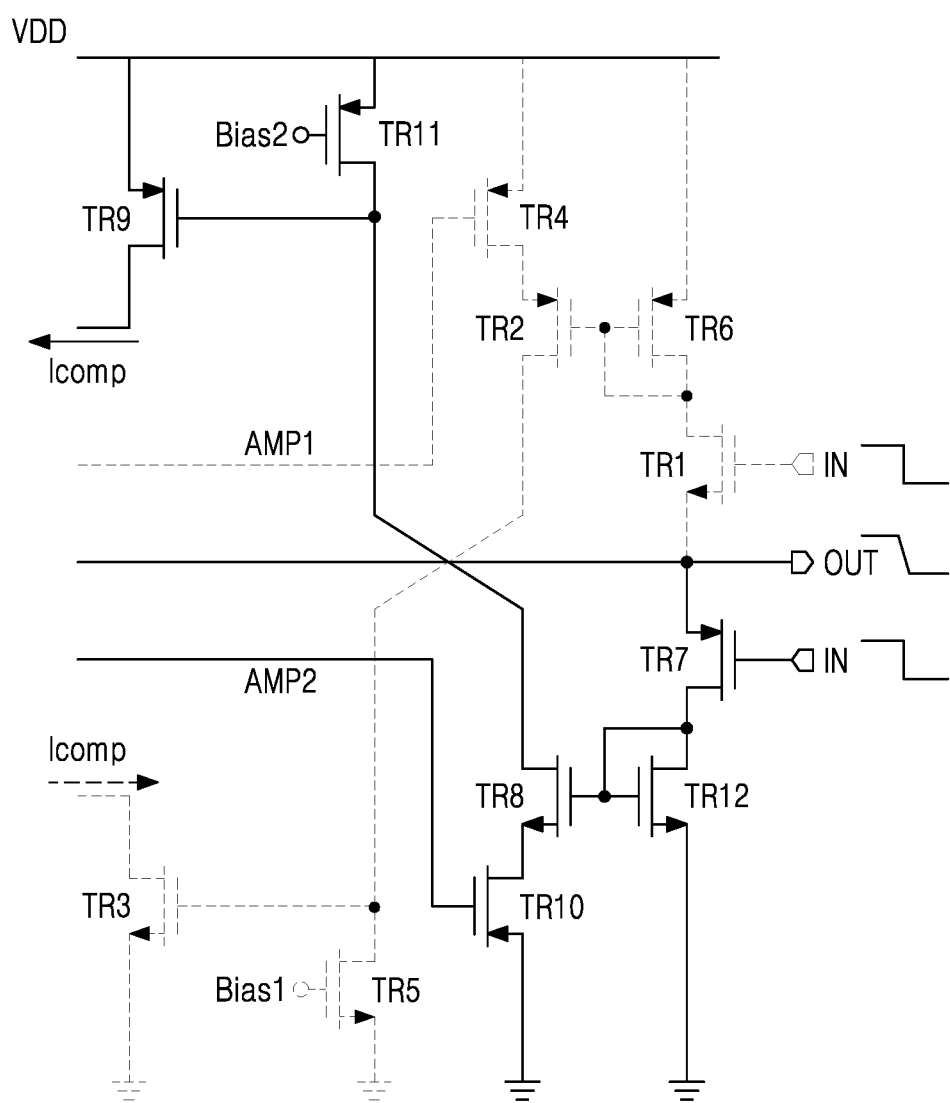

FIGS. 8A and 8B are circuit diagrams further illustrating operation of the operational amplifier compensation circuit 20b of FIG. 7 in relation to transistor activation when a voltage level of an input signal IN shifts, and a corresponding current flow in response thereto.

Referring to FIG. 8A, when the input signal IN shifts from a relatively low level (hereafter, "low") to a relatively "high" level (hereafter, "high"), or when the output signal OUT is low, transistors of a first partial compensation circuit 21b are activated. That is, the first partial compensation circuit 21b includes first to sixth transistors TR1 to TR6 and may receive a low first amplification signal AMP1 and a first bias signal Bias1 having a level defined by the operational amplifier 10.

When the input signal IN shifts to high, the output signal OUT may be maintained low, and thus, the first transistor TR1 may be activated. As a result, the gate of the fourth transistor TR4 receiving the low first amplification signal AMP1 is activated. Therefore, an internal resistance of the second transistor TR2 and an internal resistance of the fifth transistor TR5 may be effectively connected in parallel, thereby providing an output resistance having a high impedance. Accordingly, a common source amplifier may have a high voltage gain proportional to the high-impedance output resistance.

An output voltage of the common source amplifier (which is amplified in response to a voltage gain with respect to a voltage level difference between the input signal IN and the output signal OUT) may be input to a gate of the third transistor TR3, and the third transistor TR3 may generate a compensation current Icomp proportional to the output voltage of the common source amplifier.

Referring to FIG. 8B, when the input signal IN shifts from low to high, or the output signal OUT is high, transistors of a second partial compensation circuit may be activated. The second partial compensation circuit may include seventh to twelfth transistors TR7 to TR12 and may receive a high second amplification signal AMP2 and a second bias signal Bias2 having a level defined by the operational amplifier 10.

When the input signal IN shifts to low, the output signal OUT may be maintained high, and thus, the seventh transistor TR7 may be activated. Furthermore, a gate of the tenth transistor TR10 may receive a high second amplification signal AMP2, and may be activated. Therefore, an internal resistance of the eighth transistor TR8 and an internal resistance of the eleventh transistor TR11 may effectively be connected in parallel to provide an output resistance having a high impedance, and the common source amplifier may have a high voltage gain proportional to the output resistance.

An output voltage of the common source amplifier, amplified in response to a voltage gain with respect to a voltage level difference between the input signal IN and the output signal OUT, may be input to a gate of the ninth transistor TR9, and the ninth transistor TR9 may generate a compensation current Icomp proportional to the output voltage of the common source amplifier.

Figure 9:
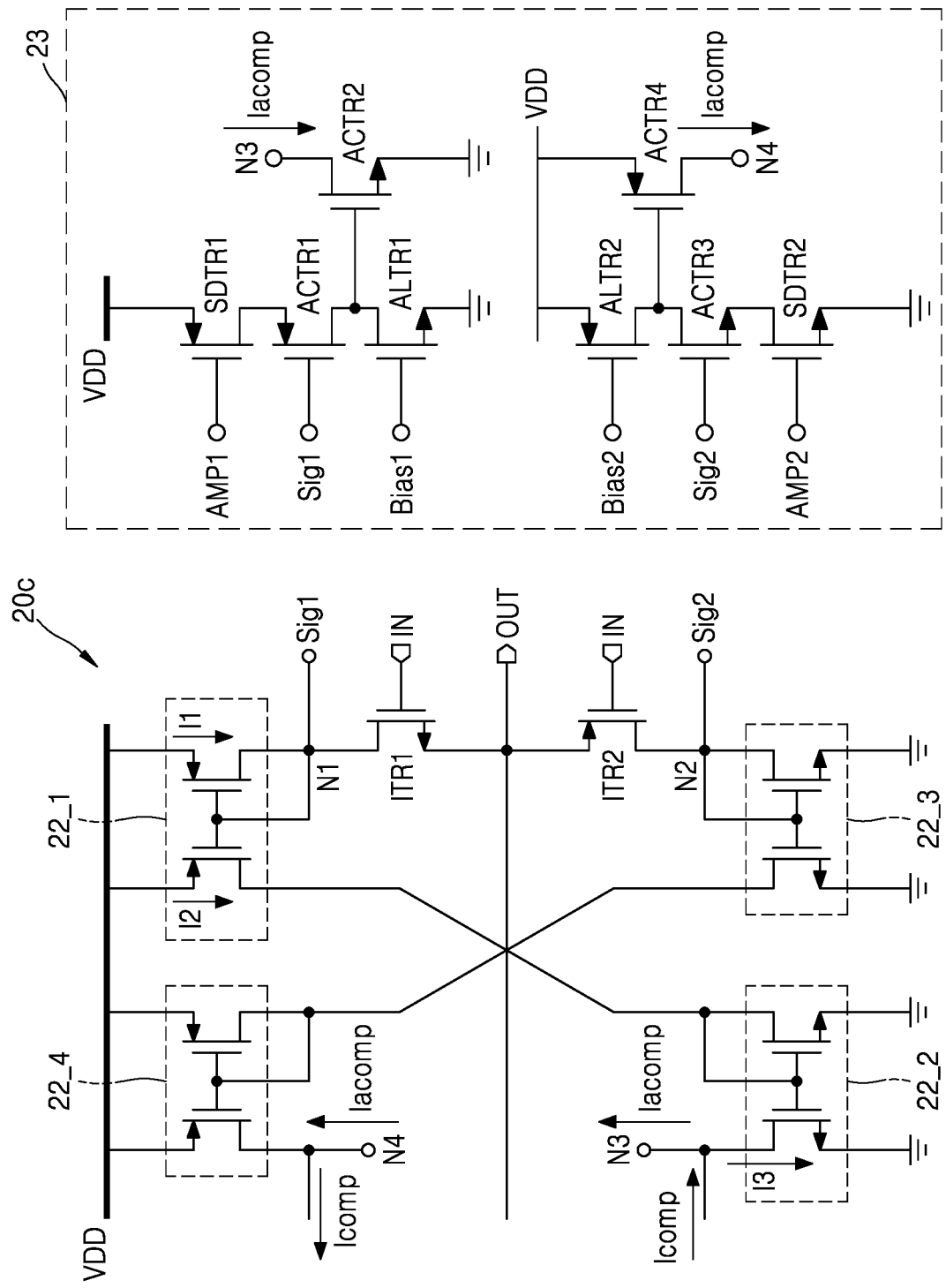
FIG. 9 is a circuit diagram illustrating an additional compensation circuit according to embodiments of the inventive concept.

FIG. 9 is a circuit diagram illustrating yet another variation (20c) of the operational amplifier compensation circuit 20 of FIG. 2, as well as an additional compensation circuit 23 that may be coupled to the operational amplifier 10 consistent with embodiments of the inventive concept.

Referring to FIGS. 2 and 9, the additional compensation circuit 23 may be coupled to a plurality of current mirror circuits, such that the operational amplifier compensation circuit 20c provides a compensation current Icomp to the operational amplifier 10. In some embodiments, the operational amplifier compensation circuit 20c may effectively provide an additional compensation current Iacomp, generated by the additional compensation circuit 23, to a third current I3 generated in response to the current mirror circuits in order to generate the compensation current Icomp.

The additional compensation circuit 23 may include a first partial additional compensation circuit and a second partial additional compensation circuit. Transistors included in the first partial additional compensation circuit may be activated when an input signal IN shifts from low to high, whereas transistors included in the second partial additional compensation circuit may be activated when the input signal IN shifts from high to low.

In some embodiments, the activation/deactivation of the additional compensation circuit 23 may be determined in response to a voltage level of each of a first bias signal Bias1 and a second bias signal Bias2. As a result, when the additional compensation circuit 23 is activated, the operational amplifier compensation circuit 20c may provide the operational amplifier 10 with the compensation current Icomp to which the additional compensation current Iacomp has been added. Alternately, in the operational amplifier compensation circuit 20c, when the additional compensation circuit 23 is deactivated, the additional compensation current Iacomp will not be added thereto, and only a drain current of a first input transistor ITR1 or a second input transistor ITR2 generated in response to a voltage difference between the input signal IN and an output signal OUT will be provided to the operational amplifier 10.

To continue, embodiments will be described assuming that the first partial additional compensation circuit and the second partial additional compensation circuit are activated, and thus, a compensation current Icomp is provided to the operational amplifier 10.

Figure 10A:
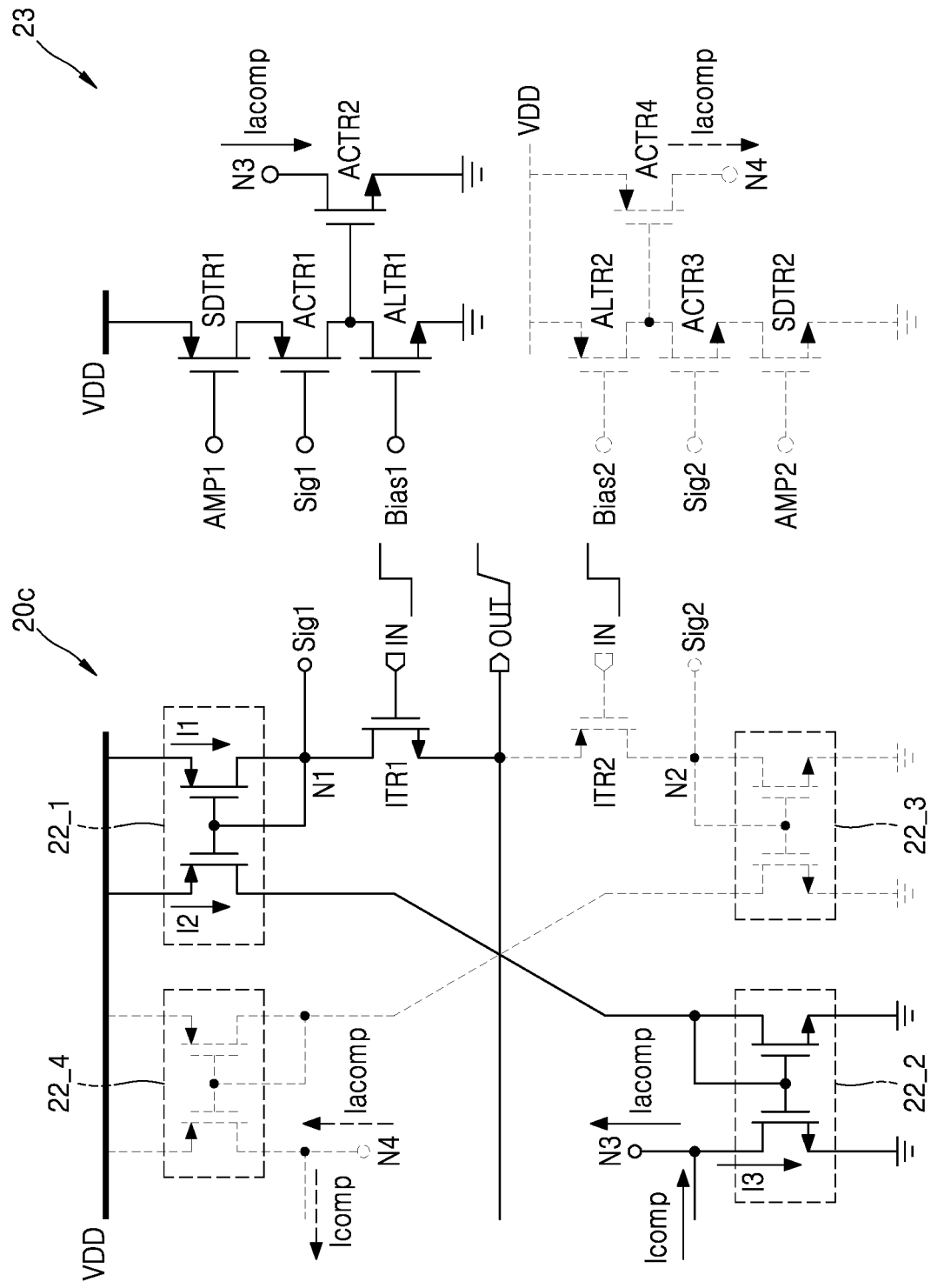
FIGS. 10A and 10B are respective circuit diagrams illustrating a transistor activated when a voltage level of an input signal shifts and resulting current flow in relation to the embodiment of FIG. 9.
Figure 10B:
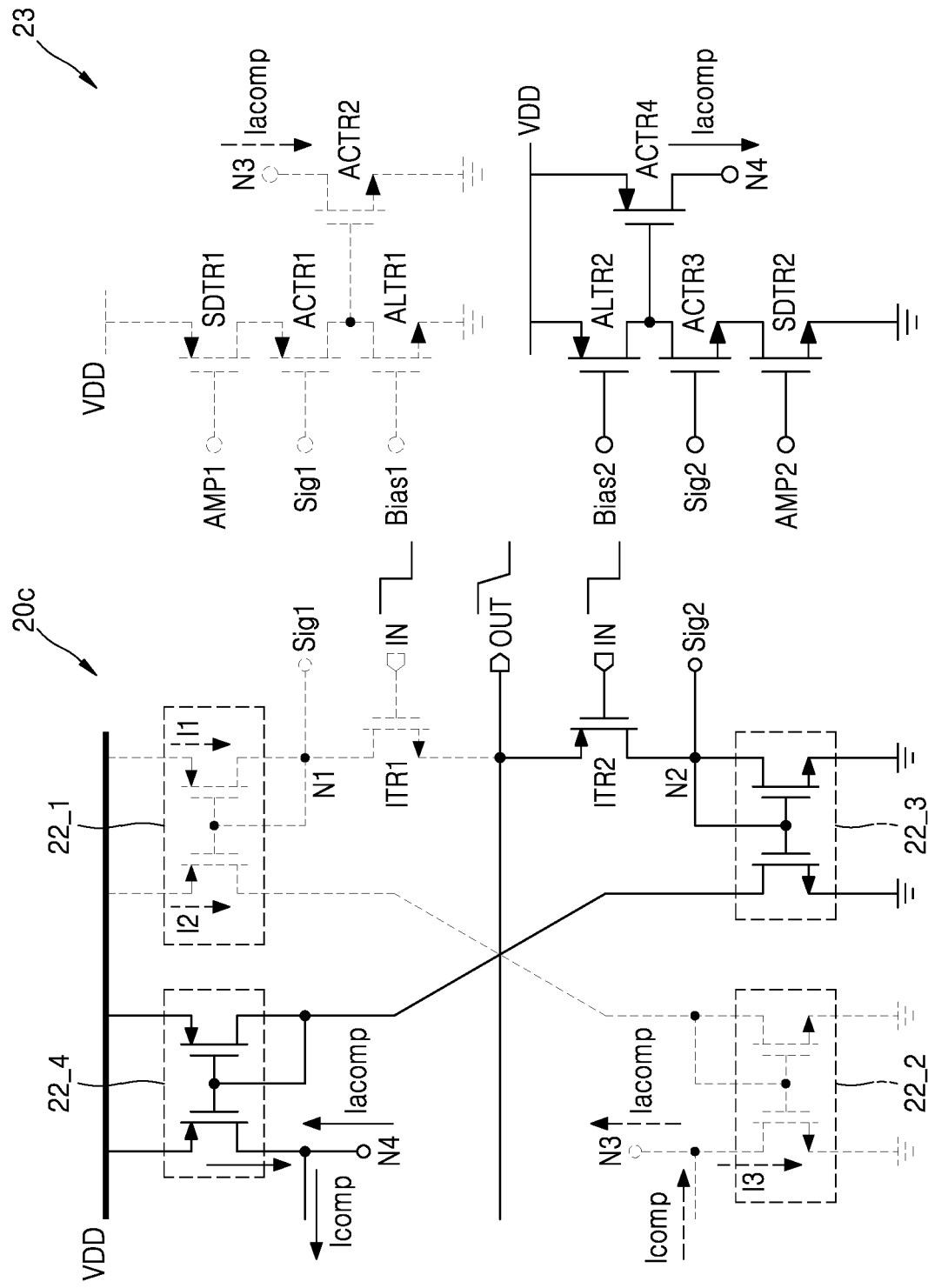

FIGS. 10A and 10B are respective circuit diagrams further illustrating operation of the additional compensation circuit 23 of FIG. 9 in response to activation of a transistor resulting from a shift in the level of the input signal IN, and the corresponding current flow.

Referring to FIG. 10A, a first partial additional compensation circuit may include a first additional compensation transistor ACTR1, a first source degeneration transistor SDTR1, a first active load transistor ALTR1, and a second active load transistor ALTR2. A gate of the first additional compensation transistor ACTR1 may be connected to a first node N1 at which a drain of a first input transistor ITR1 is disposed. When the first input transistor ITR1 is activated, the first additional compensation transistor ACTR1 may receive a low first signal Sig1 through a gate thereof, and thus, may be activated.

The first active load transistor ALTR1 may be connected to a drain of the first additional compensation transistor ACTR1 and may receive a first bias signal Bias1 through a gate thereof, and thus, may operate as a load having a variable resistance value in response to a voltage level of the first bias signal Bias1. A load connected to a drain of the first additional compensation transistor ACTR1 in some embodiments may be an active load configured with a transistor as in FIG. 9, but is not limited thereto and may be configured as a passive load.

The first source degeneration transistor SDTR1 may receive a low first amplification signal AMP1 through a gate thereof, and thus, may be activated. When the first source degeneration transistor SDTR1 is activated, the first source degeneration transistor SDTR1 may operate as a load connected to a source of the first additional compensation transistor ACTR1, and thus, may reduce a voltage gain of a common source amplifier of the first partial additional compensation circuit but may provide a stable output voltage.

A voltage gain of a common source amplifier including the first additional compensation transistor ACTR1, the first source degeneration transistor SDTR1, and the first active load transistor ALTR1 may be proportional to a parallel resistance value of an internal resistance of the first additional compensation transistor ACTR1 and an internal resistance of the first active load transistor ALTR1 and may be inversely proportional to an internal resistance of the first source degeneration transistor SDTR1. The common source amplifier may provide a gate of the second additional compensation transistor ACTR2 with an output voltage amplified by a voltage gain with respect to a voltage level between an input signal IN and an output signal OUT.

The second additional compensation transistor ACTR2 may generate an additional compensation current Iacomp proportional to the output voltage input through a gate thereof and may sink the generated additional compensation current Iacomp to a third node N3, thereby generating a compensation current Icomp. In this case, the generated compensation current Icomp may be a pull compensation current Icomp for sinking a current from an operational amplifier 10 and may reduce a time for which a voltage level of an output signal OUT of the operational amplifier shifts in response to the pull compensation current Icomp.

Referring to FIG. 10B, a second partial additional compensation circuit may include a third additional compensation transistor ACTR3, a second source degeneration transistor SDTR2, a second active load transistor ALTR2, and a fourth additional compensation transistor ACTR4. A gate of the third additional compensation transistor ACTR3 may be connected to a second node N2 at which a drain of a second input transistor ITR2 is disposed. When the second input transistor ITR2 is activated, the third additional compensation transistor ACTR3 may receive a high second signal Sig2, and may be activated.

The second active load transistor ALTR2 may be connected to a drain of the third additional compensation transistor ACTR3 and may receive a second bias signal Bias2 through a gate thereof, and thus, may operate as a load having a variable resistance value in response to a voltage level of the second bias signal Bias2. A load connected to a drain of the third additional compensation transistor ACTR3 in some embodiments may be an active load configured with a transistor as in FIG. 9, but is not limited thereto and may be configured as a passive load.

The second source degeneration transistor SDTR2 may receive a high second amplification signal AMP2 through a gate thereof, and may be activated. When the second source degeneration transistor SDTR2 is activated, the second source degeneration transistor SDTR2 may operate as a load connected to a source of the third additional compensation transistor ACTR3, and thus, may reduce a voltage gain of the common source amplifier included in the second partial additional compensation circuit 23 but may provide a stable output voltage.

A voltage gain of a common source amplifier including the third additional compensation transistor ACTR3, the second source degeneration transistor SDTR2, and the second active load transistor ALTR2 may be proportional to a parallel resistance value of an internal resistance of the third additional compensation transistor ACTR3 and an internal resistance of the second active load transistor ALTR2 and may be inversely proportional to an internal resistance of the second source degeneration transistor SDTR2. The common source amplifier may provide a gate of the fourth additional compensation transistor ACTR4 with an output voltage amplified by a voltage gain with respect to a voltage level between an input signal IN and an output signal OUT.

The fourth additional compensation transistor ACTR4 may generate an additional compensation current Iacomp proportional to the output voltage input through a gate thereof and may provide the generated additional compensation current Iacomp to a fourth node N4, thereby generating a compensation current Icomp. In this case, the generated compensation current Icomp may be a push compensation current Icomp for providing a current from an operational amplifier 10 and may reduce a time for which a voltage level of an output signal OUT of the operational amplifier shifts in response to a push compensation current Icomp.

Figure 11:
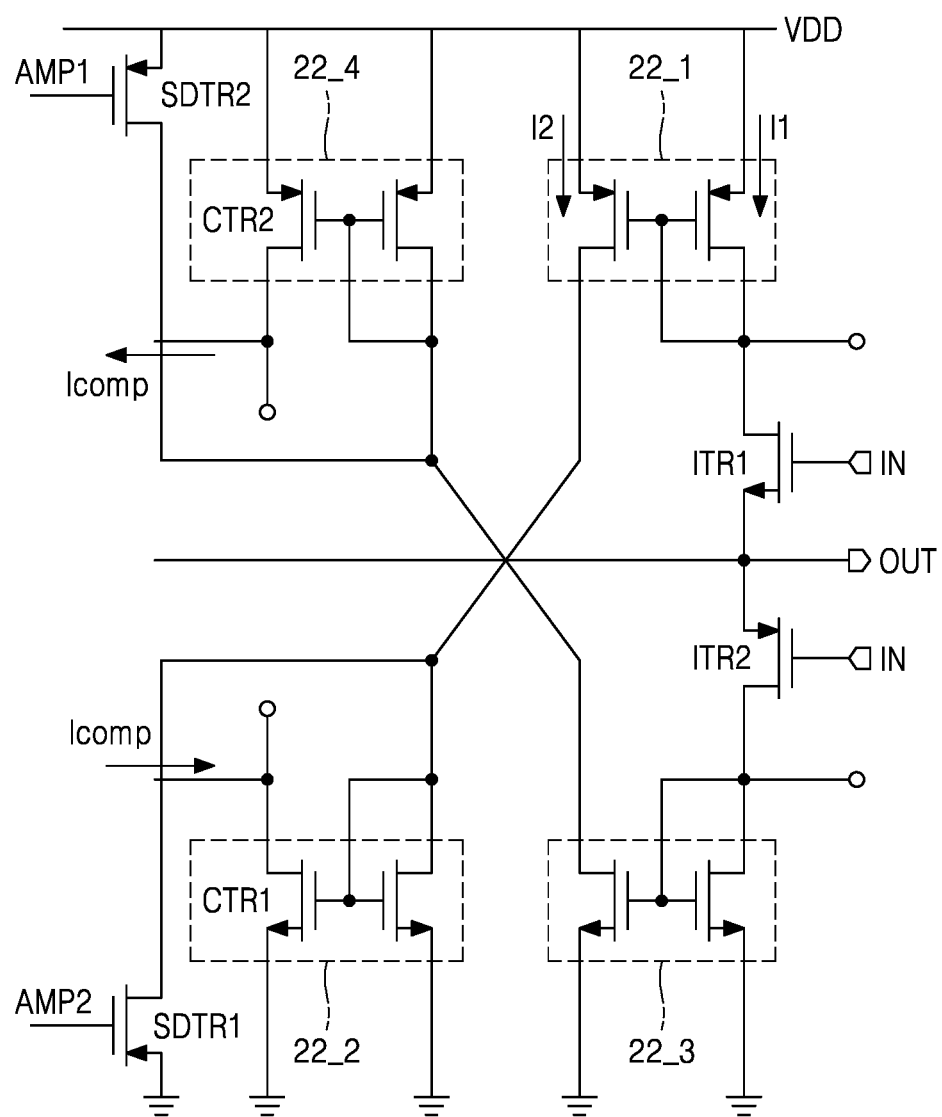
FIG. 11 is a circuit diagram illustrating an operational amplifier compensation circuit including a source degeneration transistor according to embodiments of the inventive concept.

FIG. 11 is a circuit diagram illustrating still another variation (20d) of the operational amplifier compensation circuit 20 of FIG. 2 including a source degeneration transistor according to embodiments of the inventive concept.

Referring to FIG. 11, the operational amplifier compensation circuit 20d may generate a compensation current Icomp having a level such as a first current I1 generated by a first input transistor ITR1, and at this time, may be controlled so that an operational amplifier 10 generates a stable output signal OUT using a first source degeneration transistor SDTR1 connected between a first current mirror circuit 22_1 and a second current mirror circuit 22_2.

When an input signal IN has a voltage level which is higher than that of an output signal OUT by a threshold voltage or more, the first input transistor ITR1 may be activated and may generate the first current I1 at a drain thereof. The first current mirror circuit 22_1 configured with a transistor having the same standard may generate a second current I2 having the same value as that of the first current I1 and may transfer the second current I2 to the second current mirror circuit 22_2 and the first source degeneration transistor SDTR1. The second current mirror circuit 22_2 may receive a portion of the second current I2 using the first source degeneration transistor SDTR1.

The second current mirror circuit 22_2 may generate a compensation current Icomp in response to a portion of the second current I2 received from the first current mirror circuit 22_1. The compensation current Icomp generated by the second current mirror circuit 22_2 may be a pull compensation current Icomp which sinks a current from the operational amplifier 10, and the operational amplifier 10 may shift a logic level of the output signal OUT at a higher speed, in response to the pull compensation current Icomp.

When the output signal OUT has a voltage level which is higher than that of an input signal IN by a threshold voltage or more, a second input transistor ITR2 may be activated and may generate the compensation current Icomp using a second compensation transistor CTR2. Here, a second source degeneration transistor SDTR2 disposed between a third current mirror circuit 22_3 and a fourth current mirror circuit 22_4 may receive a first amplification signal AMP1 having a logic high level through a gate thereof, and thus, may be activated.

The third current mirror circuit 22_3 may transfer a drain current, generated by the second input transistor ITR2, to the fourth current mirror circuit 22_4 and a second source degeneration transistor. The fourth current mirror circuit 22_4 may generate the compensation current Icomp in response to a current received from the third current mirror circuit 22_3. The compensation current Icomp generated by the fourth current mirror circuit 22_4 may be a push compensation current Icomp for providing a current to the operational amplifier 10, and the operational amplifier 10 may shift a logic level of the output signal OUT at a higher speed, in response to the push compensation current Icomp.

Figure 12:
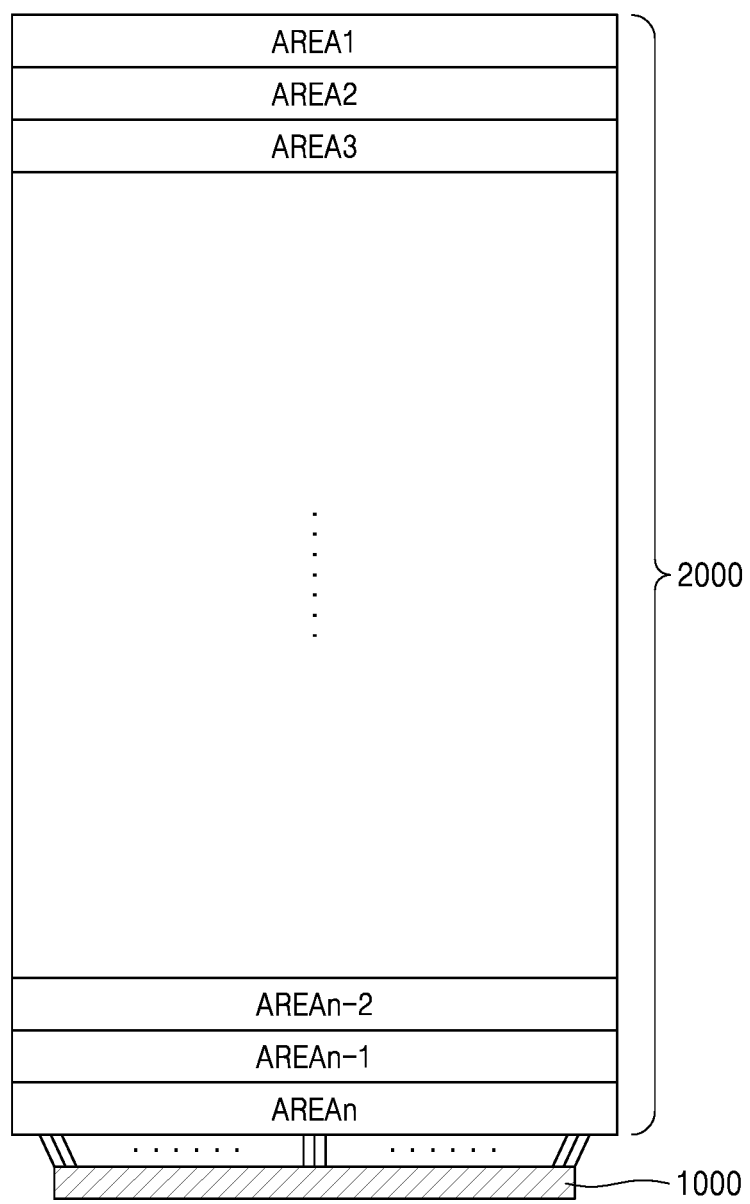
FIG. 12 is a conceptual diagram illustrating an exemplary hardware configuration for a display driver integrated circuit (IC) and display panel areas according to embodiments of the inventive concept.

FIG. 12 is a conceptual diagram illustrating an exemplary hardware configuration including a display driver integrated circuit (IC) 1000 and a display panel 2000 (potentially having various display areas) according to embodiments of the inventive concept.

Referring to FIGS. 2 and 12, the display panel 2000 may be functionally and/or physically divided into one of a number of display areas, wherein each of the display areas is variously spaced apart from the display driver IC 1000. For each display area of the display panel 2000, a delay time may increase according to a separation distance from the display driver IC 1000, and thus, the operational amplifier 10 should be controlled such that the output signal OUT reaches (or settles to) a stable state value in a shortest possible time. Furthermore, the input signal IN may be amplified in response to a gain value which may vary as a function of a distance that the output signal OUT must be transferred to respective display areas (e.g., a distance relatively farther from or closer to the display driver IC 1000).

For example, a first display panel area AREA1 of the display panel 2000 may be a display area farthest from the display driver IC 1000, and thus, more delay time may be consumed than an $n^{th}$ display panel area AREAn (where 'n' is a natural number) of the display panel 2000 and the input signal IN may be amplified in response to a greater gain value.

Hereinafter, embodiments wherein the operational amplifier compensation circuit 20 adjusts an amplification level of the output signal OUT by driving the operational amplifier compensation circuit 20 in response to an enable signal EN having different duty cycles with respect to each display area of the display panel 2000 will be described with reference to FIGS. 13, 14 and 15.

Figure 13:
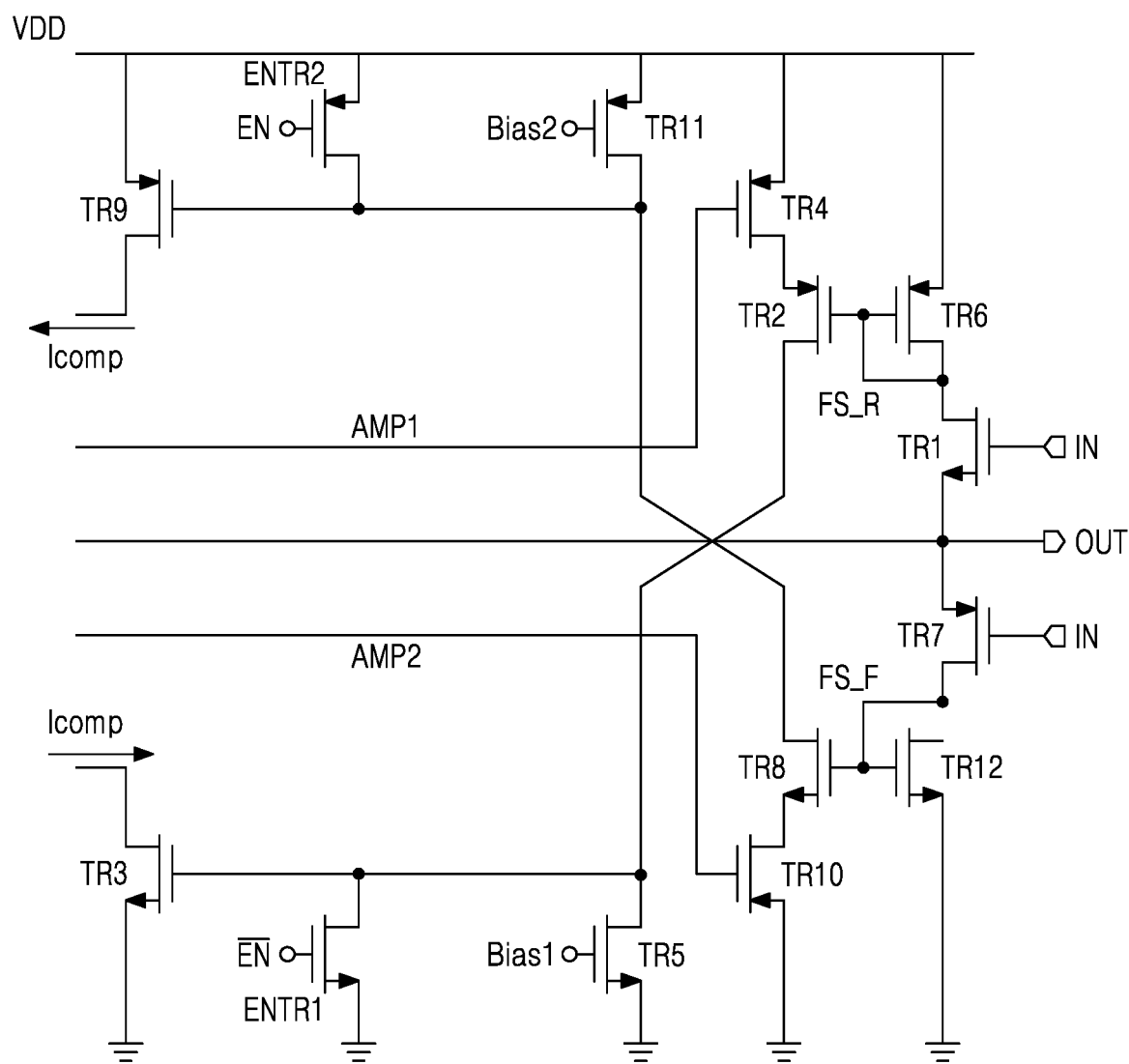
FIG. 13 is a circuit diagram illustrating an operational amplifier compensation circuit including an enable transistor according to embodiments of the inventive concept.

FIG. 13 is a circuit diagram illustrating a variation (20e) of the operational amplifier compensation circuit 20b of FIG. 7 further including at least one enable transistor.

That is, referring to FIG. 13, the operational amplifier compensation circuit 20e may further include a first enable transistor ENTR1 and a second enable transistor ENTR2, as compared with the operational amplifier compensation circuit 20b of FIG. 7. Here, for example, the first enable transistor ENTR1 may be disposed between ground and a drain of a fifth transistor TR5 that receives an inverted version ($\overline{EN}$) of an enable signal EN through its gate. The second enable transistor ENTR2 may be disposed between the source voltage VDD and a drain of an eleventh transistor TR11 receiving the enable signal EN through its gate.

When the enable signal EN is high, each of the first enable transistor ENTR1 and the second enable transistor ENTR2 is deactivated, and when the enable signal EN is low, each of the first enable transistor ENTR1 and the second enable transistor ENTR2 is activated. When the first enable transistor ENTR1 is activated, a low signal may be applied (or input) to a gate of a third transistor TR3. Thus, the third transistor TR3 is deactivated and will not generate the compensation current Icomp. Likewise, when the second enable transistor ENTR2 is activated, a high signal may be applied to a gate of a ninth transistor TR9. Thus, the ninth transistor TR9 is deactivated and will not generate the compensation current Icomp.

It follows that, when a low enable signal EN is received, the operational amplifier compensation circuit 20e of FIG. 13 may be controlled, such that compensation current Icomp is not generated, and only when a high enable signal EN is received, will the operational amplifier compensation circuit 20e may be controlled such that the compensation current Icomp is generated.

Figure 14:
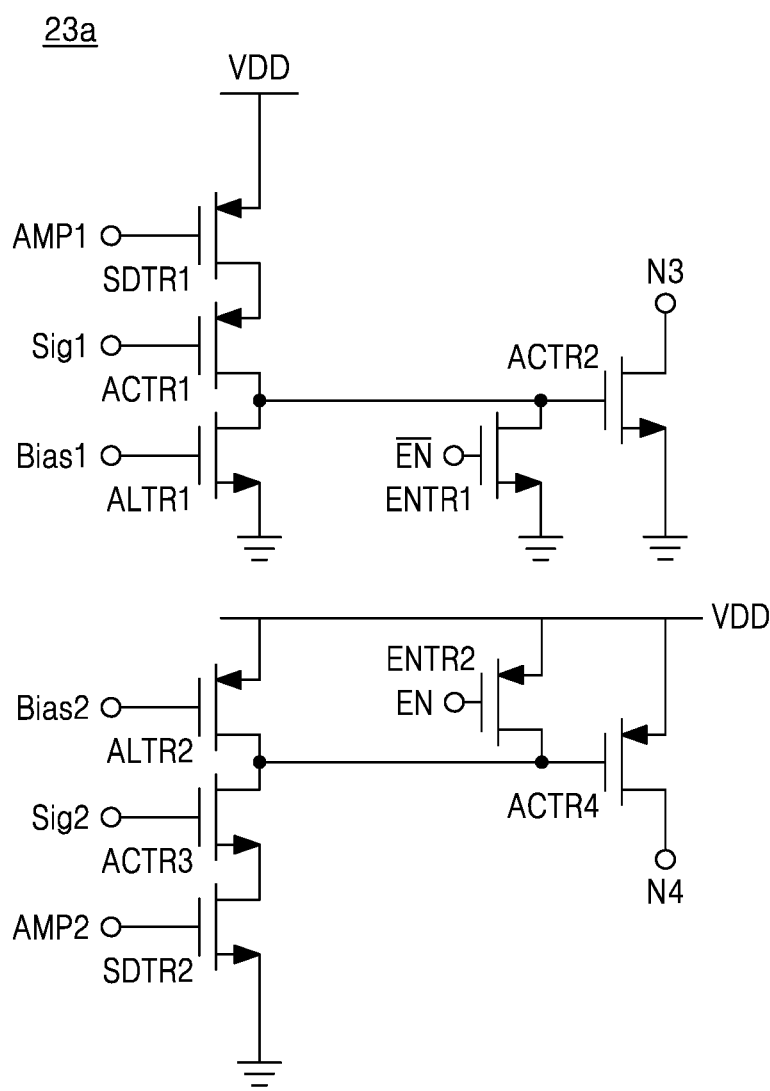
FIG. 14 is a circuit diagram illustrating an additional compensation circuit further including an enable transistor according to embodiments of the inventive concept.

FIG. 14 is a circuit diagram illustrating a variation (23a) of the additional compensation circuit 23 of FIG. 9 further including at least one enable transistor.

That is, referring to FIG. 14, the additional compensation circuit 23a may further include a first enable transistor ENTR1 and a second enable transistor ENTR2, as compared with the additional compensation circuit 23 of FIG. 9. Here, the first enable transistor ENTR1 may be disposed between ground and a gate of a second additional compensation transistor ACTR2 in a first partial additional compensation circuit, and the second enable transistor ENTR2 may be disposed between the source voltage VDD and a gate of a fourth additional compensation transistor ACTR4 in a second partial additional compensation circuit. The first enable transistor ENTR1 may receive an inverted version ($\overline{EN}$) of the enable signal EN as a gate signal, and the second enable transistor ENTR2 may receive the enable signal EN as a gate signal.

When a high enable signal EN is applied, each of the first enable transistor ENTR1 and the second enable transistor ENTR2 may be deactivated, and when a low enable signal EN is applied, each of the first enable transistor ENTR1 and the second enable transistor ENTR2 may be activated. When the first enable transistor ENTR1 is activated, a low gate signal may be applied to a gate of the second additional compensation transistor ACTR2, and thus, the second additional compensation transistor ACTR2 may be deactivated and will not generate the compensation current Icomp Likewise, when the second enable transistor ENTR2 is activated, a high gate signal may be applied to a gate of the fourth additional compensation transistor ACTR4, and thus, the fourth additional compensation transistor ACTR4 may be deactivated and will not generate the compensation current Icomp.

Figure 15:
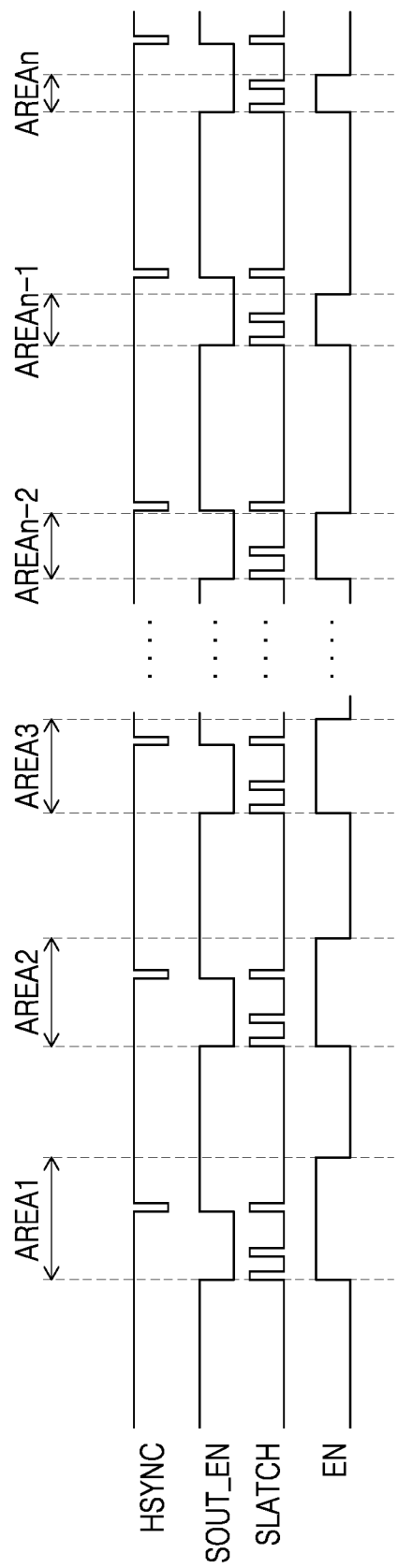
FIG. 15 is a timing diagram illustrating exemplary signal relationships associated with an enable signal duty cycle in relation to different display panel areas according to embodiments of the inventive concept.

FIG. 15 is a timing diagram illustrating various signal relationships in relation to a duty cycle of an enable signal EN, as determined in response to various display panel areas according to embodiments of the inventive concept.

Referring to FIGS. 12 and 15, in a case where the display driver IC 1000 provides an output signal OUT corresponding to a line-based display panel area, the display driver IC 1000 may temporally divide each of display panel areas and may provide the output signal OUT in response to a horizontal synchronization (HSYNC) signal. For example, after the display driver IC 1000 provides the output signal OUT to a first display panel area AREA1 in one line, the display driver IC 1000 may provide the output signal OUT to a second display panel area AREA2 and may sequentially provide the output signal OUT to the other display panel areas up to an $n^{th}$ display panel area AREAn.

Referring to FIG. 15, when the HSYNC signal shifts from high to low, an SOUT_EN signal used to activate the operational amplifier 10 may shift to high. Accordingly, when the SOUT_EN signal shifts to high, the operational amplifier 10 may be activated and may amplify the output signal OUT from the input signal IN. Before the operational amplifier 10 is activated in this manner, the display driver IC 1000 may shift the enable signal EN to high in response to an SLATCH signal. The operational amplifier compensation circuit 20 may provide the compensation current Icomp to the operational amplifier 10 in the middle of receiving the high enable signal EN.

In this case, the display apparatus in some embodiments may generate the enable signal EN having a relatively large duty cycle, so as to reduce delay, in providing the output signal OUT to a display panel area disposed at a position far away from the display driver IC 1000. Alternately, a short delay time may be consumed in a display area disposed at a position close to the display driver IC 1000 and thus, the enable signal EN may have a relatively small duty cycle.

Referring to FIGS. 12 and 15, the display driver IC 1000 may maintain the high enable signal EN for a long time in providing the output signal OUT to the first display panel area AREA1 disposed at a position far away from the display driver IC 1000 yet maintain the high enable signal EN for a short time in providing the output signal OUT to the $n^{th}$ display panel area AREAn disposed at a position close to the display driver IC 1000. Therefore, in some embodiments, the display driver IC 1000 may adaptively control operation of the operational amplifier compensation circuit 20 in relation to differently-sized display panel areas, and their respective distance from the display driver IC 1000 in order to more efficiently perform the operational amplification operation in relation to power consumption.

Figure 16:
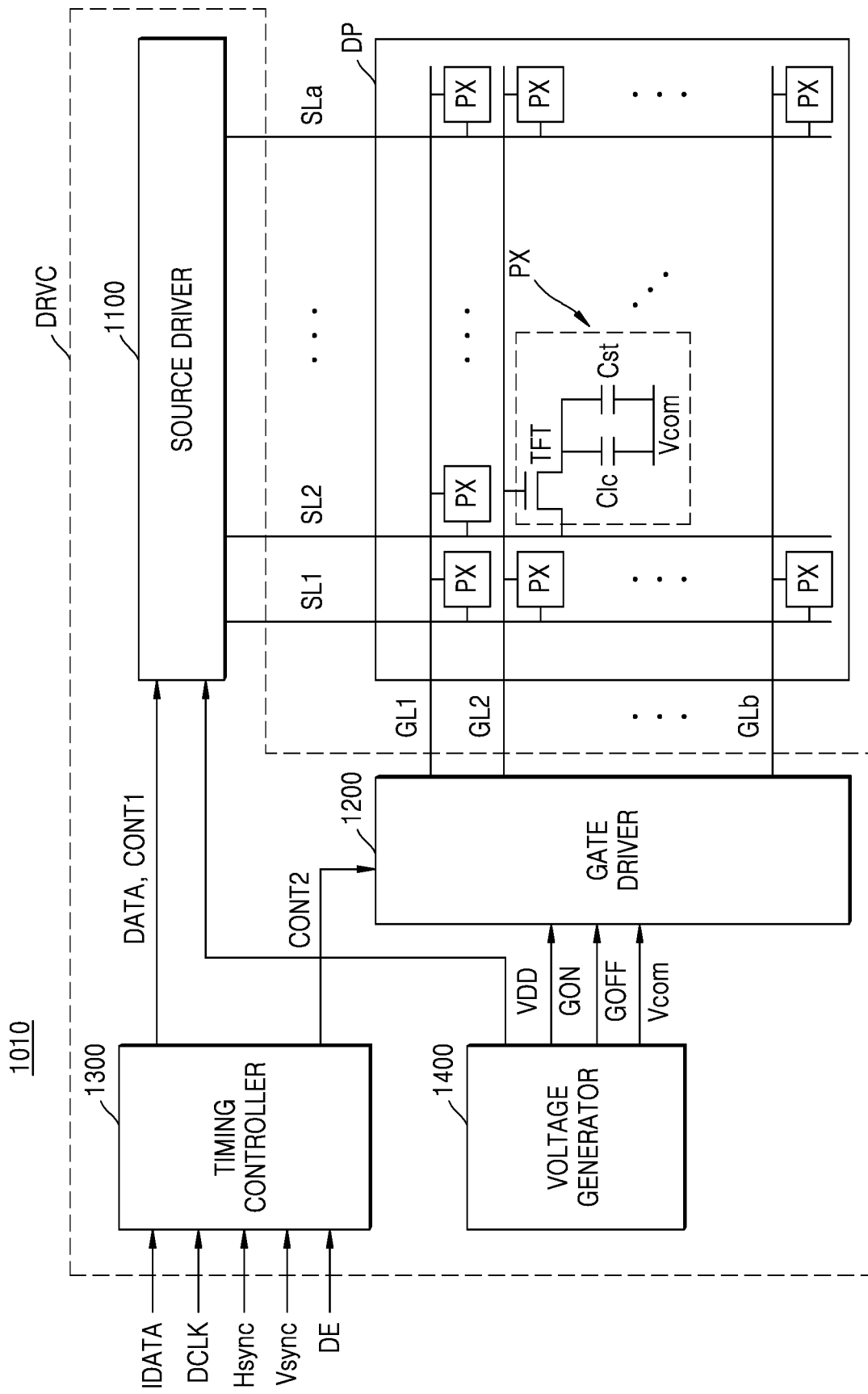
FIG. 16 is a block diagram illustrating a display apparatus according to embodiments of the inventive concept.

FIG. 16 is a block diagram of a display device 1010 according to embodiments of the inventive concept.

Referring to FIG. 16, the display device 1010 may generally include a display panel DP and a driving circuit DRVC.

The display panel DP may display an image according to a defined frame unit. The display panel DP may be embodied as an liquid crystal display (LCD) a light emitting diode (LED) display, an organic LED (OLED) display, an active-matrix OLED (AMOLED) display, and a flexible display, a flat panel display, etc. For descriptive convenience, it is assumed that the display panel DP is an LCD panel.

The display panel DP includes first to bth gate lines GL1 to GLb arranged in a row direction, first to ath source lines SL1 to SLa arranged in a column direction, and pixels PX formed at intersection points where the first to bth gate lines GL1 to GLb intersect with the first to ath source lines SL1 to SLa. Within the display panel DP, each of the pixels PX may include a thin film transistor (TFT), a liquid crystal capacitor Clc and a storage capacitor Cst connected to a drain of the TFT. A common voltage Vcom may be connected to the other end of the liquid crystal capacitor Clc and the storage capacitor Cst. When the first to bth gate lines GL1 to GLb are sequentially scanned, a TFT of a pixel PX connected to a selected gate line is turned on and a gradation voltage corresponding to pixel data is applied to each of the first to ath source lines SL1 to SLa. The gradation voltage is applied to the liquid crystal capacitor Clc and the storage capacitor Cst via a TFT of corresponding pixel PX, and a display operation is performed as the liquid crystal capacitor Clc and the storage capacitor Cst are driven.

The driving circuit DRVC may include a source driver 1100, a gate driver 1200, a timing controller 1300, and a voltage generator 1400, wherein the driving circuit DRVC may be realized as a single semiconductor chip or a plurality of semiconductor chips (e.g., a System-on-Chip (or SoC)).

The timing controller 1300 may receive image data IDATA and a plurality of control signals (e.g., a horizontal synchronization signal Hsync, a vertical synchronization signal Vsync, a clock signal DCLK, and a data enable signal DE received from an external device (e.g., a host device, not shown)), and may generate a first control signal CNT1 and a second control signal CNT2 to control the gate driver 1200 and the source driver 1100 in response to the plurality of control signals. The first control signal CNT1 may be a control signal corresponding to the source driver 1100 and the second control signal CNT2 may be a control signal corresponding to the gate driver 1200.

Furthermore, the timing controller 1300 may generate data (DATA) by converting the format of the externally-provided image data IDATA in accordance with to interface specifications for the source driver 1100. The timing controller 1300 may then control communication of the data to the source driver 1100.

The gate driver 1200 and the source driver 1100 may drive the pixels PX of the display panel DP according to the first and second control signals CNT1 and CNT2 provided from the timing controller 1300.

The source driver 1100 drives the first to ath source lines SL1 to SLa of the display panel DP in response to the first control signal CNT1. The source driver 1100 may output a gradation voltage corresponding to pixel data to the first to ath source lines SL1 to SLa of the display panel DP.

The source driver 1100 may include a single chip or a plurality of source driving chips. Here, the timing controller 1300 may divide the externally-provided image data IDATA into segments (e.g. pieces) of source data according to an area of the display panel DP driven by each of the source driving chips. The source driver 1100 may also communicate the divided segments of source data to the corresponding source driving chips, respectively. Furthermore, the timing controller 1300 may transmit corresponding control signals together with the segments of source data to the source driving chips, respectively.

The source driver 1100 may include the operational amplifier 10, wherein the operational amplifier 10 may be used to amplify an input signal IN in order to generate an output signal OUT to a display panel DP. Here, the operational amplifier compensation circuit 20 may supply a compensation current Icom to the operational amplifier 10 in order to increase a slew rate of the output signal OUT in response to the compensation current Icomp, thereby reducing a settling time $t_{set1}$ for various logic level shifts. Various embodiments of the inventive concept provide variations of the operational amplifier compensation circuit 20 capable of generating the compensation current Icom, as described above.

The gate driver 1200 sequentially scans the first to bth gate lines GL1 to GLb of the display panel DP. The gate driver 1200 activates a selected gate line by applying a gate-on voltage GON to the selected gate line, and the source driver 1100 outputs a gradation voltage corresponding to pixels PX connected to the activated gate line. Therefore, the display panel DP may display an image in accordance with horizontal line units (e.g., line-by-line).

The voltage generator 1400 generates voltages used by the driving circuit DRVC and the display panel DP. The voltage generator 1400 may generate the gate-ON voltage GON, a gate-OFF voltage GOFF, the common voltage Vcom, and a power voltage VDD. The gate-ON voltage GON and the gate-OFF voltage GOFF are provided to the gate driver 1200 and used to generate gate signals applied to the first to bth gate lines GL1 to GLb. The common voltage Vcom is commonly provided to the pixels PX of the display panel DP. As illustrated in FIG. 16, the common voltage Vcom may be provided to one end of the liquid crystal capacitor Clc and the storage capacitor Cst.

The display device 1010 of FIG. 16 may be incorporated within (e.g., mounted on) various electronic devices requiring an image display function. Examples of such electronic devices include a television (TV), a digital video disk (DVD) player, an audio player, a refrigerator, an air conditioner, a smart phone, a tablet personal computer (PC), a mobile phone, a video phone, an e-book reader, a desktop computer, a laptop computer, a netbook computer, a personal digital assistant (PDA), a portable multimedia player (PMP), an MP3 player, a mobile medical instrument, a camera, and a wearable device (e.g., a head-mounted device (HMD) such as electronic glasses, smart garments, a smart bracelet, a smart necklace, an electronic accessory, electronic tattoos, a smart watch, etc.), a medical device, a navigation device, a global positioning system (GPS) receiver, an automatic teller's machine (ATM), etc. In some embodiments, the display device 1000 may be a flexible device.

While the inventive concept has been particularly shown and described with reference to embodiments thereof, it will be understood that various changes in form and details may be made therein without departing from the spirit and scope of the following claims.

What is claimed is:

1. An operational amplifier compensation circuit, comprising:
 a first transistor activated/deactivated in response to a level difference between an input signal applied to an operational amplifier and an output signal provided by the operational amplifier;
 a first signal amplifying circuit including a second transistor and a first load, wherein the first signal amplifying circuit is configured to generate a first gate voltage based on the level difference between the input signal and the output signal when the first transistor is activated; and
 a third transistor configured to generate a first compensation current in response to the amplified first gate voltage, and provide the first compensation current to the operational amplifier,
 wherein the first signal amplifying circuit further includes a fourth transistor connected to the second transistor, and
 activation of the fourth transistor is based on a voltage level of a first amplification signal provided by the operational amplifier.

2. The operational amplifier compensation circuit of claim 1, wherein the first signal amplifying circuit is configured to generate the amplified first gate voltage based on a parallel combination of an internal resistance of the second transistor and a resistance of the first load.

3. The operational amplifier compensation circuit of claim 1, wherein, upon activation of the fourth transistor, the first signal amplifying circuit is further configured to generate the first gate voltage based on an internal resistance of the second transistor, a resistance of the first load, and an internal resistance of the fourth transistor.

4. The operational amplifier compensation circuit of claim 1, wherein the first load includes a fifth transistor receiving a first bias voltage as a gate voltage and having a resistance that is based on the first bias voltage.

5. The operational amplifier compensation circuit of claim 1, wherein the first signal amplifying circuit further includes a self-biased, sixth transistor including a gate connected to a gate of the second transistor.

6. The operational amplifier compensation circuit of claim 1, further comprising:
 a seventh transistor activated when the level difference between the input signal and the output signal differs from a level activating the first transistor;
 a second signal amplifying circuit including an eighth transistor and a second load, wherein the second signal amplifying circuit is configured to, when the seventh transistor is activated, generate a second gate voltage amplified in response to the level difference between the input signal and the output signal, based on an internal resistance of the eighth transistor and a resistance of the second load; and
 a ninth transistor configured to generate a second compensation current in response to the amplified second gate voltage and provide the second compensation current to the operational amplifier.

7. The operational amplifier compensation circuit of claim 6, wherein the second signal amplifying circuit further includes a tenth transistor connected to the eighth transistor, and
 activation of the tenth transistor is based on a voltage level of a second amplification signal provided by the operational amplifier.

8. The operational amplifier compensation circuit of claim 6, wherein the first transistor is an NMOS transistor,
 the seventh transistor is a PMOS transistor,
 upon activation of the first transistor, the third transistor is configured to generate a pull compensation current sinking current of the operational amplifier, and
 upon activation of the seventh transistor, the ninth transistor is configured to generate a push compensation current supplying current to the operational amplifier.

9. The operational amplifier compensation circuit of claim 6, further comprising:
 a first enable transistor configured to control the first gate voltage, such that the third transistor is deactivated when the first enable transistor is activated, and activation/deactivation of the first enable transistor is determined in response to an enable signal; and
 a second enable transistor configured to control the second gate voltage, such that the ninth transistor is deactivated when the second enable transistor is activated, the activation/deactivation of the second enable transistor is determined in response to the enable signal.

10. The operational amplifier compensation circuit of claim 9, wherein at least one of the first enable transistor or the second enable transistor is configured to determine a time period duration which the first compensation current or the second compensation current is provided to the operational amplifier in relation to a duty cycle of the enable signal.

11. An operational amplifier circuit compensating a slew rate of an output signal provided by the operational amplifier circuit, wherein the operational amplifier circuit comprises:
   an amplifying circuit configured to provide an amplification signal by amplifying a difference between an input signal applied to the operational amplifier circuit and the output signal;
   an output circuit configured to generate the output signal in response to the amplification signal; and
   a compensation circuit configured to receive the amplification signal and provide a compensation current generated in response to the amplification signal to the output circuit, wherein the compensation circuit includes a source degeneration transistor configured to receive the amplification signal as a gate signal, and wherein activation/deactivation of the source degeneration transistor is determined in response to a voltage level of the amplification signal,
   wherein the output circuit is further configured to generate the output signal in relation to the compensation current to reduce a signal level shift time.

12. The operational amplifier circuit of claim 11, wherein the compensation circuit comprises a compensation transistor configured to generate the compensation current, and
   the source degeneration transistor is connected to a source/drain of the compensation transistor.

13. The operational amplifier circuit of claim 12, wherein the compensation circuit comprises:
   an input transistor configured to generate a first current on the basis of a signal level difference between the input signal and the output signal;
   a first current mirror circuit configured to output a second current having the same level as a level of the first current; and
   a second current mirror circuit configured to receive the second current to generate the compensation current, the second current mirror including the compensation transistor.

14. The operational amplifier circuit of claim 11, wherein the compensation circuit comprises:
   a first transistor, wherein activation/deactivation of the first transistor is determined based on a first signal amplifying circuit including a second transistor and a first load, the first signal amplifying circuit being configured to, when the first transistor is activated, generate a first gate voltage amplified based on a voltage level difference between the input signal and the output signal on the basis of an internal resistance of the second transistor and a resistance of the first load;
   a third transistor configured to generate a first compensation current on the basis of the amplified first gate voltage and to provide the first compensation current to the operational amplifier circuit; and a fourth transistor connected to one end of the second transistor, wherein activation/deactivation of the fourth transistor is based on the voltage level of the amplification signal.

15. An operational amplifier compensation circuit for assisting an amplification operation of an operational amplifier, the operational amplifier compensation circuit comprising:
   a first input transistor configured to generate a first current on the basis of a signal level difference between an input signal and an output signal of the operational amplifier;
   a first current mirror circuit connected to a source terminal or a drain terminal of the first input transistor to output a second current having the same level as a level of the first current;
   a second current mirror circuit configured to receive the second current to generate a third current; and
   an additional compensation circuit including a first additional compensation transistor and a first load, the additional compensation circuit being configured to provide the second current mirror circuit with an additional compensation current generated based on an internal resistance of the first additional compensation transistor and a resistance of the first load when the first input transistor is activated, wherein
   a compensation current obtained by summating the additional compensation current and the third current is provided to the operational amplifier.

16. The operational amplifier compensation circuit of claim 15, wherein the additional compensation circuit further comprises a first source degeneration transistor including a source terminal or a drain terminal connected to the first additional compensation transistor, wherein activation/deactivation of the first source degeneration transistor is based on an amplification signal of the operational amplifier differentiated from the input signal and the output signal.

17. The operational amplifier compensation circuit of claim 15, wherein the first load comprises a first active load transistor configured to receive a first bias voltage through a gate thereof and to have a resistance level determined based on a voltage value of the first bias voltage.

18. The operational amplifier compensation circuit of claim 15, further comprising:
   a second input transistor configured to generate a fourth current on the basis of the signal level difference between the input signal and the output signal;
   a third current mirror circuit connected to a source terminal or a drain terminal of the second input transistor to output a fifth current having the same level as a level of the fourth current; and
   a fourth current mirror circuit configured to receive the fifth current to generate a sixth current, wherein the additional compensation circuit comprises a third additional compensation transistor and a second load,
   the additional compensation circuit being configured to provide the fourth current mirror circuit with an additional compensation current generated based on an internal resistance of the third additional compensation transistor and a resistance of the second load when the second input transistor is activated, and
   a compensation current obtained by summating the additional compensation current and the sixth current is provided to the operational amplifier.

* * * * *